(12) United States Patent
Nagashima et al.

(10) Patent No.: US 10,063,094 B2
(45) Date of Patent: Aug. 28, 2018

(54) POWER MANAGEMENT SYSTEM AND POWER OUTLET UNIT

(71) Applicant: ROHM CO., LTD., Kyoto (JP)

(72) Inventors: Mitsunori Nagashima, Kyoto (JP); Masahide Tanaka, Osaka (JP)

(73) Assignee: Rohm Co., Ltd., Kyoto (JP)

( * ) Notice: Subject to any disclaimer, the term of this patent is extended or adjusted under 35 U.S.C. 154(b) by 246 days.

(21) Appl. No.: 14/905,389

(22) PCT Filed: Jul. 11, 2014

(86) PCT No.: PCT/JP2014/068573
§ 371 (c)(1),
(2) Date: Jan. 15, 2016

(87) PCT Pub. No.: WO2015/008706
PCT Pub. Date: Jan. 22, 2015

(65) Prior Publication Data
US 2016/0156227 A1 Jun. 2, 2016

(30) Foreign Application Priority Data

Jul. 19, 2013 (JP) .................................. 2013-150792
Dec. 18, 2013 (JP) .................................. 2013-261345

(51) Int. Cl.
*H02J 13/00* (2006.01)
*H04Q 9/00* (2006.01)
(Continued)

(52) U.S. Cl.
CPC ...... *H02J 13/0017* (2013.01); *G01R 19/2513* (2013.01); *G01R 21/00* (2013.01);
(Continued)

(58) Field of Classification Search
CPC .............................................. H02J 13/0017
(Continued)

(56) References Cited

U.S. PATENT DOCUMENTS

| 2013/0314073 A1 | 11/2013 | Nebu | |
| 2015/0220101 A1* | 8/2015 | Aisa | H02J 3/14 307/31 |
| 2015/0248117 A1* | 9/2015 | Furuya | H02J 3/14 361/622 |

FOREIGN PATENT DOCUMENTS

| JP | 2010-093590 | 4/2010 |
| JP | 2011-254229 | 12/2011 |

(Continued)

OTHER PUBLICATIONS

Akeyama, H., "Multifunctional Outlet with Web Functions," Proceedings of FIT2008 7th Forum on Information Technology 1: pp. 259-262 (2008).

(Continued)

*Primary Examiner* — Joseph Chang
(74) *Attorney, Agent, or Firm* — Fish & Richardson P.C.

(57) ABSTRACT

A power management system having: a power supply unit; a power meter that detects the total power consumption of power supplied from the power supply unit; a plurality of current sensors that each detect the current flowing to a plurality of power consumption units connected to the power supply unit; and a control unit that calculates the power consumption of each of the plurality of power consumption units by using the power meter and the plurality of current sensors. A power outlet unit having: an outlet to which power is supplied from the power supply unit; a current sensor that detects the current flowing through the outlet to the power consumption unit connected to the outlet; and a transmission unit that sends current detection results from the current sensor to the power supply unit.

16 Claims, 11 Drawing Sheets

(51) Int. Cl.
  *G01R 19/25* (2006.01)
  *G01R 21/00* (2006.01)
  *H02J 3/14* (2006.01)

(52) U.S. Cl.
  CPC ............... *H02J 3/14* (2013.01); *H04Q 9/00* (2013.01); *H02J 2003/143* (2013.01); *H04Q 2209/60* (2013.01); *Y02B 90/2607* (2013.01); *Y04S 40/12* (2013.01)

(58) Field of Classification Search
  USPC .......................................................... 307/31
  See application file for complete search history.

(56) References Cited

FOREIGN PATENT DOCUMENTS

| | | |
|---|---|---|
| JP | 2013-243555 | 12/2013 |
| WO | 2012/111373 | 8/2012 |

OTHER PUBLICATIONS

Asano, H., et al., Smart Grid Textbook, 1st ed., Kabushikigaisha Impress Japan, pp. 188-205 (2011).

Fukui, R,. et al, "An Intelligent-Outlet-Tap for Controlling and Monitoring Legacy Appliance," DVD-ROM of Proceedings of the 27—the Annual Conference of the Robotics Society of Japan (the Robotics Society of Japan): pp. 2579-2581 (2009) (with English abstract).

Japanese Patent Office, International Search Report for PCT/JP2014/068573 dated Aug. 19, 2014 (with English translation).

Kato, T., et al., "i-Energy Profile: Energy Informationization Profile by Smart-Tap Network," The Journal of Institute of Electronics, Information and Communication Engineers J94-B(10): pp. 1232-1245 (2011).

Morimoto, N., et al, "A Smart Tap for Intelligent and Active Power Control," Proceedings of Information Processing Society of Japan Kansai Brunch Conference vol. 2011 (Information Processing Society of Japan): F-101 (2011).

Tsukamoto, M., et al., "Informatization of Energy: Electric Power Management by IT," Information processing 51(8): pp. 934-942 (2010).

Office Action for corresponding Japanese Patent Application No. 2013-261345 dated Nov. 7, 2017 (with English translation).

* cited by examiner

POWER MANAGEMENT SYSTEM AND POWER OUTLET UNIT

TECHNICAL FIELD

The present invention relates to a power management system and a power outlet unit (a connection relaying unit).

BACKGROUND ART

There have been made many proposals for power management systems, and for power outlet units used for distribution of electric power. Power outlet units are specifically known as wall sockets and power strips. For example, according to one proposal for power outlets, a control signal that reflects operation on an operation panel is transmitted to each power outlet to control a power distribution controller provided in the power outlet, thereby to turn on and off the supply of electric power to a load. According to this proposal, each power outlet is provided with an address setter which assigns it a unique address so that, when an address included in a received transmission signal matches the one assigned to the power outlet by the address setter, the power distribution controller turns on and off a contact based on the control signal (Patent Document 1). Another proposal is directed to the reading of identifying information stored in IC tags in power plugs of electric appliances in the field of automatic control of electric appliances, a hot-water supply installation, etc. in a household through the monitoring of their energy consumption and operation status (Patent Document 2).

LIST OF CITATIONS

Patent Literature

Patent Document 1: Japanese Patent Application Publication No. 2010-093590
Patent Document 2: Japanese Patent Application Publication No. 2011-254229

SUMMARY OF THE INVENTION

Technical Problem

For power management systems and power outlet units to be more useful, many problems are still to be studied. On the other hand, common home appliances are not always capable of being controlled or being monitored for electric power consumption.

Against the background discussed above, the present invention aims to propose more useful power management systems and power outlet units, thereby to make it possible to control, and monitor the electric power consumption of, even a home appliance that is incapable of being controlled or being monitored for electric power consumption.

Means for Solving the Problem

According to one aspect of the present invention, a power management system includes: a power supplier; a power meter which detects the total power consumption of electric power supplied from the power supplier; a plurality of current sensors which detect electric currents passing respectively through a plurality of power consumers connected to the power supplier; and a controller which calculates the power consumption by each of the plurality of power consumers based on the power meter and the plurality of current sensors (a first configuration).

Preferably, the power management system according to the first configuration further includes: a power outlet unit to which electric power is supplied from the power supplier, the power outlet unit including a plurality of outlets to which the plurality of power consumers are connected respectively. Here, the plurality of current sensors are provided respectively in the plurality of outlets to which the plurality of power consumers are connected respectively (a second configuration). Preferably, in the power management system according to the second configuration, the controller controls the supply of electric power to the respective outlets (a third configuration).

Preferably, in the power management system according to the second configuration, the power outlet unit includes a transmitter which transmits the results of current detection by the current sensors to the power supplier (a fourth configuration). Preferably, in the power management system according to the first configuration, the controller includes an inferrer which infers the kinds of the plurality of power consumers based on the electric currents detected respectively by the plurality of current sensors (a fifth configuration).

According to another aspect of the present invention, a power outlet unit includes: an outlet to which electric power is supplied from a power supplier; a current sensor which detects an electric current passing via the outlet through a power consumer connected to the outlet; and a transmitter which transmits the result of current detection by the current sensor to the power supplier (a sixth configuration).

Preferably, in the power outlet unit according to the sixth configuration, the transmitter transmits, to the power supplier, identifying information by which a power consumer connected to the outlet is identified (a seventh configuration). Preferably, in the power outlet unit according to the sixth configuration, the transmitter transmits, to the power supplier, information on whether or not a power consumer is connected to the outlet (an eighth configuration).

Preferably, the power outlet unit according to the sixth configuration further includes: a switch which turns on and off the outlet based on control from the controller (a ninth configuration). Preferably, in the power outlet unit according to the sixth configuration, a control signal is fed to a power consumer connected to the outlet based on control from the controller (a tenth configuration).

According to yet another aspect of the present invention, a power management system includes: a power supplier; a plurality of current sensors which detect electric currents supplied from the current supplier and passing respectively through a plurality of power consumers; and a controller which infers the kinds of the plurality of power consumers based on the electric currents detected respectively by the plurality of current sensors (an eleventh configuration).

Preferably, in the power management system according to the eleventh configuration, the controller is provided in the current supplier (a twelfth configuration). Preferably, the power management system according to the eleventh configuration further includes: a power outlet unit which receives electric power from the power supplier, the power outlet unit including a plurality of outlets to which the plurality of power consumers are connectible and a plurality of switches which control the supply of electric power to the outlets respectively. Here, the current sensors and the controller are provided in the power outlet unit (a thirteenth configuration).

Preferably, in the power management system according to the eleventh configuration, the controller infers the kinds of the power consumers based on variation of the electric currents passing through the power consumers (a fourteenth configuration). Preferably, in the power management system according to the fourteenth configuration, the controller infers the kinds of the power consumers based on one of, or a combination of two or more of, a maximum current, a current variation width, and a current variation pattern with respect to the electric currents passing through the power consumers (a fifteenth configuration).

Preferably, in the power management system according to the eleventh configuration, the controller infers the kinds of the power consumers based on a time factor with respect to the electric currents passing through the power consumers (a sixteenth configuration). Preferably, in the power management system according to the sixteenth configuration, the controller infers the kinds of the power consumers based on one of, or a combination of, a current consumption time zone and a current consumption frequency with respect to the electric currents consumed by the power consumers (a seventeenth configuration). Preferably, in the power management system according to the eleventh configuration, the controller includes a storage in which a history of variation of the electric currents as fed from the current sensors is stored (an eighteenth configuration).

Preferably, in the power management system according to the thirteenth configuration, the plurality of current sensors are provided in the power outlet unit, and the power outlet unit includes a communicator which transmits, to the current supplier, results of current detection by the plurality of current sensors and which receives, from the current supplier, control signals for controlling the plurality of switches (a nineteenth configuration). Preferably, in the power management system according to the nineteenth configuration, even when a control signal is received from the current supplier, a switch corresponding to a outlet to which an uninferred power consumer is connected is not controlled (a twentieth configuration).

Advantageous Effects of the Invention

As described above, according to the present invention, more useful power management systems and power outlet units are provided. Moreover, according to the present invention, it possible to control, and monitor the electric power consumption of, even a home appliance that is incapable of being controlled or being monitored for electric power consumption.

DESCRIPTION OF EMBODIMENTS

Example 1

Figure 1:
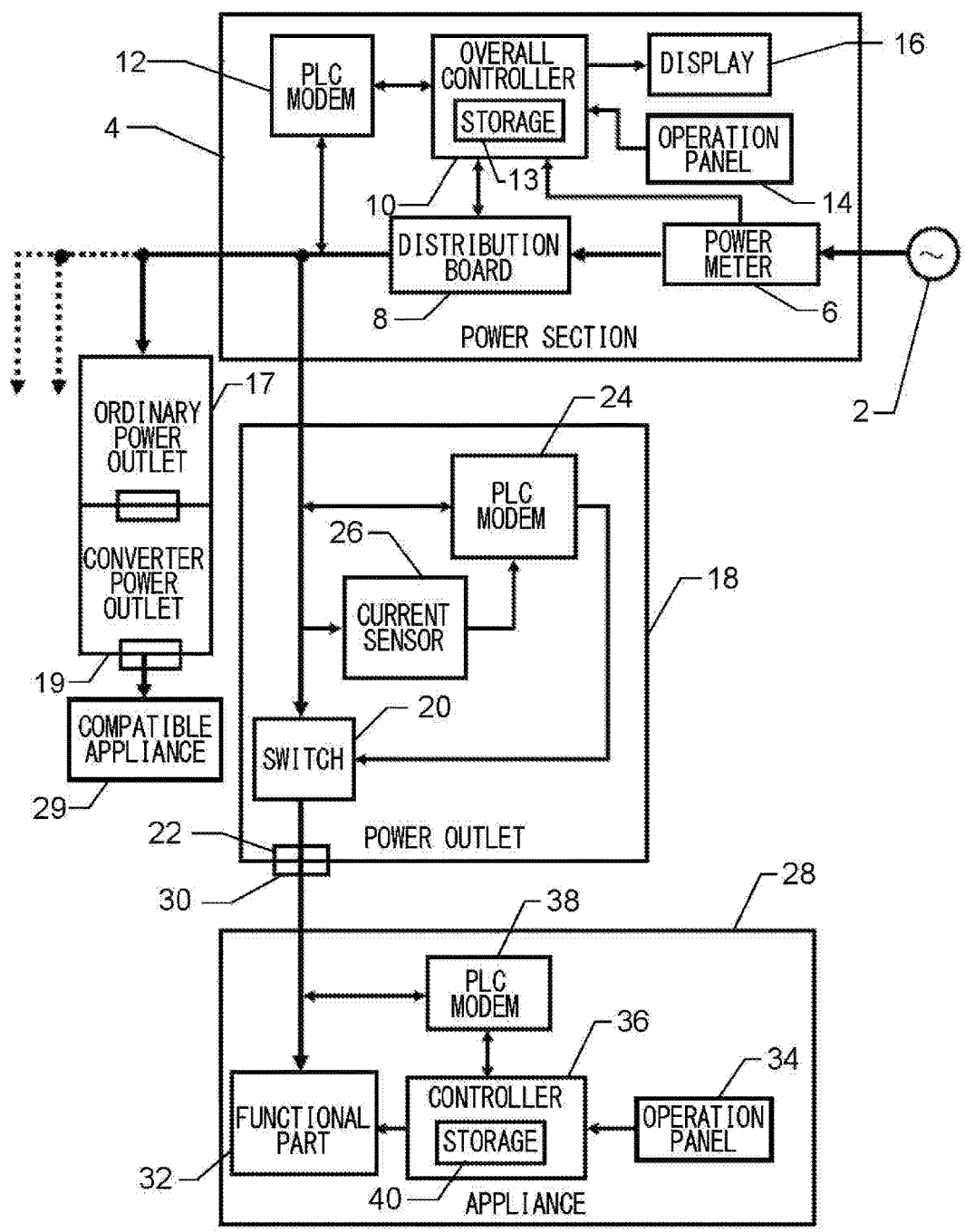
FIG. 1 is a system diagram showing an overall configuration of Example 1 of the present invention (Example 1)

FIG. 1 is a block diagram showing an overall configuration of one embodiment, Example 1, of the present invention. Example 1 constitutes a power outlet system in a household. A commercial power supply 2 is diverted to a power section 4 in the household, and is then connected, via a power meter 6, to a distribution board 8. An overall controller 10 controls, and monitors the status of, the distribution board 8. The overall controller 10 controls the power outlet system in the household by transmitting, via a PLC (power-line communication) modem 12, control signals in a form superposed on current signals passing through a power line. The overall controller 10 includes a storage 13, in which information on which home appliances are connected to which sockets in which power outlets is stored as will be described later. The overall controller 10 is controlled through settings made on an operation panel 14, and how it is being controlled is displayed on a display 16. The display 16 also displays total and appliance-by-appliance electric power consumption based on the results of detection of electric currents passing through respective power outlet sockets and the reading on the power meter.

To the distribution board 8 are connected power outlets which are arranged at different places in the household. In FIG. 1, for simplicity's sake, only one power outlet 18 is illustrated in detail while others are omitted. As indicated by broken lines, a number of similar power outlets can be connected to the distribution board 8. These power outlets can be controlled by the overall controller 10, and how that is done will be described in detail with respect to the power outlet 18. The power outlet 18 receives electric power from the distribution board 8, and outputs it from a socket 22 via a switch 20. The power outlet 18 includes a PLC modem 24, which splits a control signal transmitted from the overall controller 10 by power-line communication and, based on it, turns on and off the switch 20. For example, when a long journey or the like is planned, a standby current off mode can be invoked for the socket 22 through operation on the operation panel 14; the overall controller 10 then transmits a control signal to turn off the switch 20, so that an unnecessary standby current to an appliance 28 connected to the socket 22 can be turned off. For another example, a timer can be set on the operation panel 14 such that the overall controller 10 keeps the switch 20 off only during a predetermined time zone of the day and keeps it on during the rest of the day.

The power outlet 18 is provided with a current sensor 26, which monitors the electric current passing via the socket 22, and transmits a monitoring signal to the power section 4 via the PLC modem 24 by power-line communication. In the power section 4, the monitoring signal is split by the PLC modem 12 and is received by the overall controller 10. The monitoring signal serves three purposes. The first purpose is to infer a socket 22 that causes a change in the total electric power reading on the power meter 6 based on a change in the monitoring signal of the electric current passing via the socket 22 and the corresponding change in the total electric power reading on the power meter. The electric power consumed via the inferred socket 22 is then calculated. By grasping socket-by-socket electric power consumption in this way and displaying the results on the display 16, it is possible to "visualize" appliance-by-appliance electric power consumption. It is also possible, when the total electric power exceeds a predetermined peak, to identify one or more appliances that are causing the excess, and to comprehensively control individual appliances to reduce total electric power consumption.

The second purpose of the monitoring signal is to turn off the supply of electric power to a socket via which no electric current is being consumed by an appliance. Specifically, when the electric current being monitored by the current sensor 26 remains zero for a predetermined length of time or more, the overall controller 10 recognizes that the socket 22 is vacant, with no plug of an appliance 28 inserted in it; the overall controller 10 then transmits a control signal to turn off the switch 20. Even after turning off the switch 20, the overall controller 10 transmits to the switch 20, every predetermined period, a control signal to turn on the switch 20 for a short period to check whether or not the current sensor 26 detects an electric current. If an electric current is detected, it is recognized that a plug of an appliance 28 has been inserted in it, and the switch 20 is thereafter kept on. It is not only when a plug of an appliance 28 is disconnected, but also when, while a plug is left inserted, the main power to an appliance 28 is turned off and its current consumption drops to completely zero, that the switch 20 is turned off based on the monitoring signal from the appliance 28. Also in this case, when the main power to the appliance 28 is turned back on, this is recognized based on the monitoring signal from the current sensor 26, and the switch 20 is turned on.

The third purpose of the monitoring signal is to turn off the supply of electric power to a socket at fault. Specifically, when the electric current being monitored by the current sensor 26 is higher than the rated value, it is recognized that either the appliance 28 is at fault or the socket 22 is short-circuited by an inserted foreign object; the overall controller 10 thus transmits a control signal to turn off the switch 20. The limit current value over which a fault is recognized can be set on a socket-by-socket basis based on information from an appliance connected to a socket. To cope with appliances which provide no information, a current value equal to or higher than one improbable in their normal use but lower than one posing an imminent danger is set for common use. This common limit current value is set to be higher than the limit current values set based on information from individual appliances but lower than the current value at which a breaker on the distribution board 8 is activated. In this way, it is possible to turn off the supply of electric current finely for each socket in each power outlet before the breaker on the distribution board is activated.

An appliance 28 is connected via a plug 30 to a socket 22 in a power outlet 18, and includes a functional part 32 which executes the functions of the appliance 28 per se. The appliance 28 can be, for example, a television, refrigerator, air conditioner, light, vacuum cleaner, washing machine, or the like. The functional part 32 is controlled by a controller 36 based on manual operation performed, or manual settings made, on an operation panel 34. The controller 36 can also automatically control the functional part 32 based on a control signal received from the overall controller 10 by power-line communication and split by a PLC modem 38. The controller 36 discriminates whether or not a control signal is directed to the appliance 28 based on an IP address included in the control signal. On receiving a control signal directed to the appliance 28, the controller 36 automatically controls the functional part 32 based on it. Specifically, in a case where the appliance 28 is an air conditioner, the functional part 32 is so controlled that the cooling operation of the appliance 28 does not overlap with, for example, the refrigerating operation of a refrigerator connected to a socket in another power outlet. In this way, the overall controller 10 transmits control signals to individual appliances to shift the time zones in which power-consuming functions are executed, thereby to achieve overall control such that the total electric power reading on the power meter 6 does not exceed a predetermined peak.

The controller 36 includes a storage 40, in which an IP address that identifies the appliance 28 is stored. By a predetermined protocol, the controller 36 transmits the IP address via the PLC modem 38 to the overall controller 10. In the overall controller 10, the IP address assigned to the socket 22 in the power outlet 18 is stored in the storage 13. Based on this IP address, the overall controller 10 recognizes the monitoring signal from the current sensor 26 and turns on and off the switch 20. In the storage 13 are also stored the IP addresses of different appliances connected in the system as received from them respectively. In the storage 13 is further stored the correspondence between the IP addresses of appliances and the IP addresses of sockets 22, so that the overall controller 10 can recognize which appliances are connected to which sockets in order to grasp appliance-by-appliance electric power consumption and to control individual appliances. An IP address that identifies an appliance 28 is transmitted to the overall controller 10, for example, when electric power starts to be supplied to the household (and also when the supply of electric power is restarted after an electric outage), or when a plug 30 is newly inserted in a socket 22, or when a switch 20 is turned on. The overall controller 10 then checks it against the previously transmitted IP addresses stored in the storage 13, and if there has been any change, the stored IP addresses are updated.

In a case where an appliance in which no IP address is stored or that is incapable of transmitting one to the overall controller 10 is connected to a socket 22 in a power outlet 18, an ID identifying such an appliance is assigned as the IP address of the socket 22 manually on the operation panel 14. This ID can be determined arbitrarily by a user. In this case, the appliance cannot be controlled, but on the basis of the ID assigned as the IP address of the socket 22, it is possible to identify the appliance and calculate its electric power consumption in similar manners as described above. Then, by displaying the calculated value on the display 16, it is possible to "visualize" the electric power consumption of the appliance.

Now, a description will be given of a converter power outlet 19 shown in FIG. 1. The converter power outlet 19 has quite the same configuration as the power outlet 18 (comprising a current sensor, a PLC modem, and a switch). A difference is that the converter power outlet 19 is provided not as a built-in fitting of the house which is directly wired to the distribution board 8, but as an adaptor which, when inserted in a socket in an ordinary power outlet 17 that is not configured as a controllable one, converts it into a controllable power outlet. That is, by inserting a plug of a converter power outlet 19 in a socket in an ordinary power outlet 17, and then inserting a plug of a compatible appliance 29, that is, an appliance capable of PLC communication or the like into a socket in the converter power outlet 19, it is possible to coordinate the compatible appliance 29 with, and control it from, the power section 4 in quite the same manner as described above with respect to the power outlet 18 and the appliance 28.

Example 2

Figure 2:
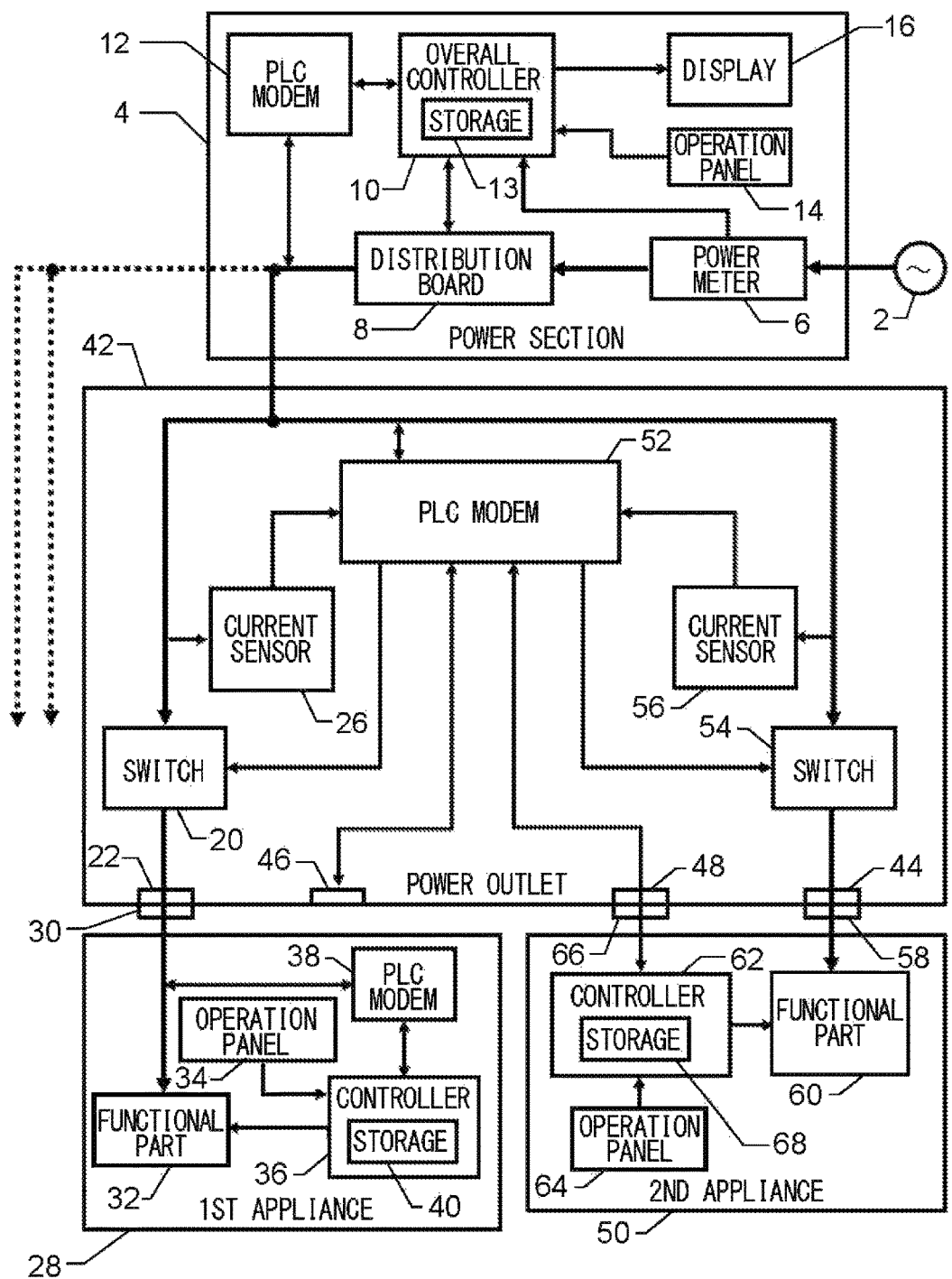
FIG. 2 is a system diagram showing an overall configuration of Example 2 of the present invention (Example 2)

FIG. 2 is a block diagram showing an overall configuration of another embodiment, Example 2, of the present invention. Example 2 too constitutes a power outlet system in a household. Example 2 in FIG. 2 has much in common with Example 1 in FIG. 1; accordingly the same parts are identified by common reference signs and no overlapping description will be repeated unless necessary. Example 2 differs from Example 1 in that a power outlet 42 is a two-socket power outlet which additionally has a second socket 44, and that the power outlet 42 further has control connectors 46 and 48 for appliance control. The appliance 28 in Example 2 is identical with the appliance 28 in Example 1, and its coordination with the power section 4 via the power outlet 42 is the same as in Example 1; therefore no overlapping description will be repeated. When the appliance 28, which is controlled by power-line communication, is connected to a first socket 22 (identical with the socket 22 in FIG. 1), the first control connector 46, which corresponds to it, is not used.

Example 2 will now be described in detail, with focus placed on the relationship with a second appliance 50. As mentioned above, in Example 2, the power outlet 42 is provided with a first socket 22 and a first control connector 46 corresponding to it, which together constitute a first pair, and in addition a second socket 44 and a second control connector 48 corresponding to it, which together constitute a second pair. Although in FIG. 2 the first appliance 28 is connected to the first socket 22 and the second appliance 50 is connected to the second socket 44, this can be the other way around. Thus, the power outlet 42 is provided with two similarly configured parts to allow a given appliance to be connected to either of the sockets. The first and second control connectors 46 and 48 are for conducting communication across them when an appliance incapable of power-line communication is connected to the first or second socket 22 or 44 respectively. Specifically, the power outlet 42 includes a PLC modem 52, which splits a control signal and an IP address request signal transmitted from the overall controller 10 to output the result to the control connectors 46 and 48, and which integrates an IP address signal received from the control connectors 46 and 48 into the electric current passing through the power line to transmit it to the overall controller 10.

In connection with the second socket 44, there are provided a switch 54 and a current sensor 56. These are similar to the switch 20 and the current sensor 26 which are provided in connection with the first socket 22. Based on the IP address contained in a split control signal, the PLC modem 52 discriminates whether the control signal is directed to the first or the second socket 22 or 44 and turns on or off the switch 20 or the switch 54 accordingly.

The second appliance 50, which is connected via a plug 58 to the second socket 44 in the power outlet 42, just like the first appliance 28, includes a functional part 60 which executes the functions of the second appliance 50 per se. The second appliance 50 too can be, for example, a television, refrigerator, air conditioner, light, vacuum cleaner, washing machine, or the like, and is no different in nature from the first appliance 28 except that the second appliance 50 is incapable of power-line communication. As in the first appliance 28, the functional part 60 of the second appliance 50 is controlled by a controller 62 based on manual operation performed, or manual settings made, on an operation panel 64. The controller 62 is connected via a control plug 66 to the second control connector 48 in the power outlet 42. Thus, the controller 62 can communicate with the overall controller 10 by means of signals exchanged with the overall controller 10 by power-line communication and split and integrated by the PLC modem 52. Specifically, based on the IP address contained in a control signal received via the control plug 66, the controller 62 discriminates whether or not the control signal is directed to the second appliance 50, and if so the controller 62 automatically controls the functional part 60 based on the control signal. In this way, in a similar manner as described previously in connection with the first appliance 28 in Example 1, it is possible to shift the time zones in which power-consuming functions are executed in relation to other appliances, thereby to achieve overall control such that the total electric power reading on the power meter 6 does not exceed a predetermined peak.

As in the first appliance 28, the controller 62 of the second appliance 50 includes a storage 68, in which an IP address that identifies the second appliance 50 is stored. By a predetermined protocol, the controller 62 transmits the IP address via the PLC modem 52 in the power outlet 42 to the overall controller 10. In the overall controller 10, the received IP address of the second appliance 50 is stored in the storage 13. In the storage 13 is also stored the IP address assigned to the second socket 44 in the power outlet 42, and based on this IP address, the overall controller 10 recognizes the monitoring signal from the current sensor 56 and turns on and off the switch 54. In the storage 13 is further stored the correspondence between the IP address of the second appliance 50 and the IP address of the second socket 44, so that the overall controller 10 can recognize which appliance is connected to which socket in order to grasp appliance-by-appliance electric power consumption and to control individual appliances.

Example 3

Figure 3:
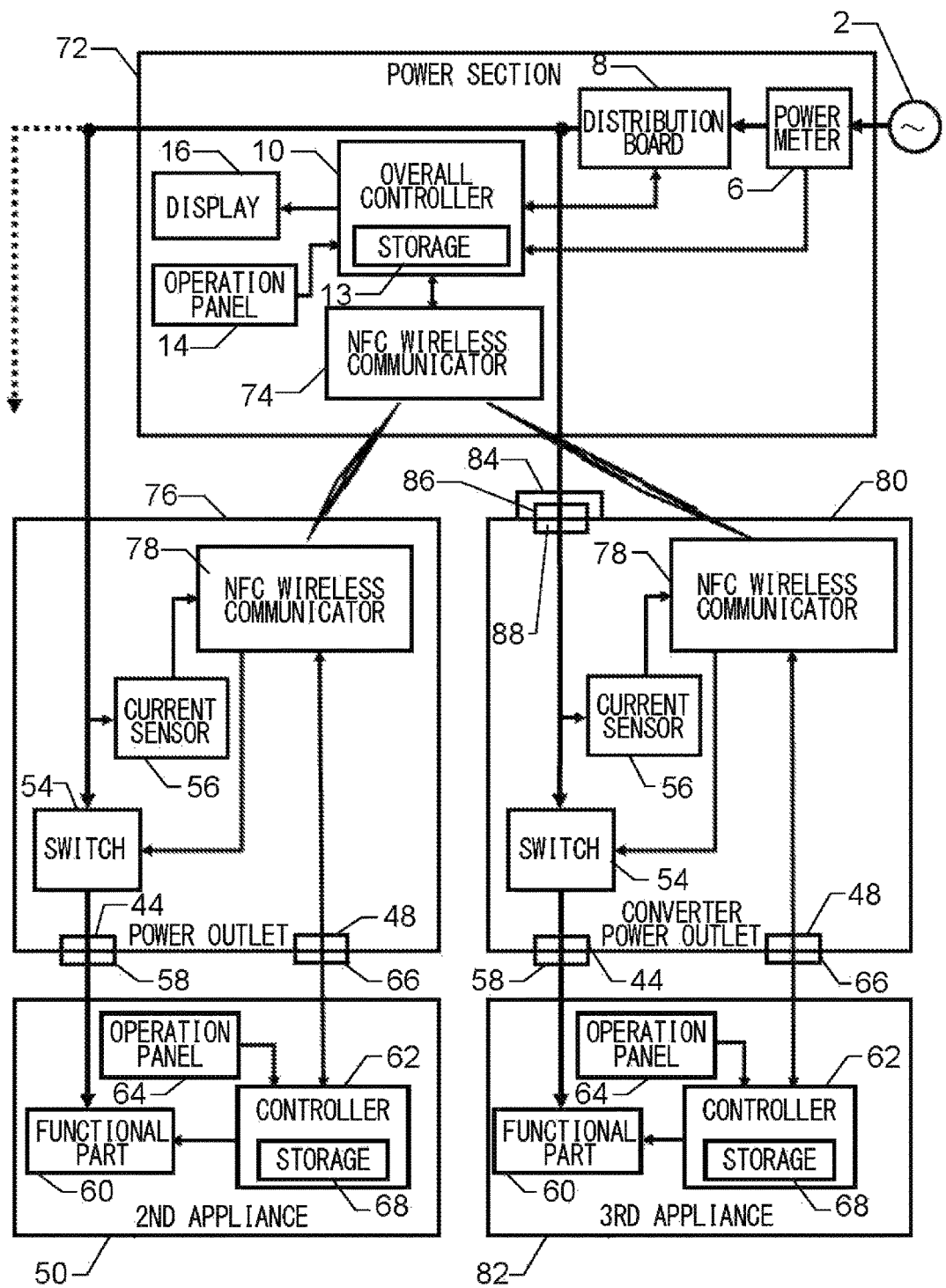
FIG. 3 is a system diagram showing an overall configuration of Example 3 of the present invention (Example 3)

FIG. 3 is a block diagram showing an overall configuration of yet another embodiment, Example 3, of the present invention. Example 3 too constitutes a power outlet system in a household. Example 3 in FIG. 3 has much in common with Examples 1 and 2 in FIGS. 1 and 2; accordingly, the same parts are identified by common reference signs, and no overlapping description will be repeated unless necessary. Example 3 differs from Examples 1 and 2 in that communication between the power section and a power outlet is achieved not by power-line communication but by near-field communication (NFC).

Specifically, to the overall controller 10 in the power section 72, an NFC wireless communicator 74 is connected, so that the overall controller 10 can communicate with power outlets by near-field communication. Correspondingly, a power outlet 76 includes an NFC wireless communicator 78, and communicates with the NFC wireless communicator 74 in the power section 72. The relationship between the NFC wireless communicator 78 in the power outlet 76 and the control connector 48 is comparable with the relationship, in Example 2 in FIG. 2, between the PLC modem 52 and the second control connector 48, and so are the functions of the components involved. In other respects, i.e., with respect to the switch 54 and the current sensor 56, the power outlet 76 is configured similarly as in Example 2 in FIG. 2; accordingly, equivalent parts are identified by common reference signs, and no overlapping description will be repeated. Also, the second appliance 50, which is connected via a plug 58 to the second socket 44 in the power outlet 76 and which is connected via a control plug 66 to the control connector 48 in the power outlet 76, is configured similarly as in Example 2 in FIG. 2; accordingly, equivalent parts are identified by common reference signs, and no overlapping description will be repeated.

A converter power outlet 80 and a third appliance 82 in Example 3 in FIG. 3 are basically configured similarly to the power outlet 76 and the second appliance 50. Accordingly, equivalent parts are identified by common reference signs, and no overlapping description will be repeated. Between the power outlet 76 and the converter power outlet 80, their respective switches 54 and current sensors 56 are distinguished based on IP addresses; thus they are distinguished in a similar manner as are the switch 20 and the current sensor 26 in Example 2 in FIG. 2.

Like the converter power outlet 19 described in connection with Example 1 in FIG. 1, the converter power outlet 80 differs from the power outlet 76 in that the converter power outlet 80 is provided not as a built-in fitting of the house which is directly wired to the distribution board 8, but as an adaptor of which a plug 88 is inserted in a socket 86 in an ordinary power outlet 84. The converter power outlet 80 thus converts the ordinary power outlet 84 into a controllable power outlet, thereby making it possible to grasp the electric power consumption by the third appliance 82 and to control the third appliance 82.

Figure 4:
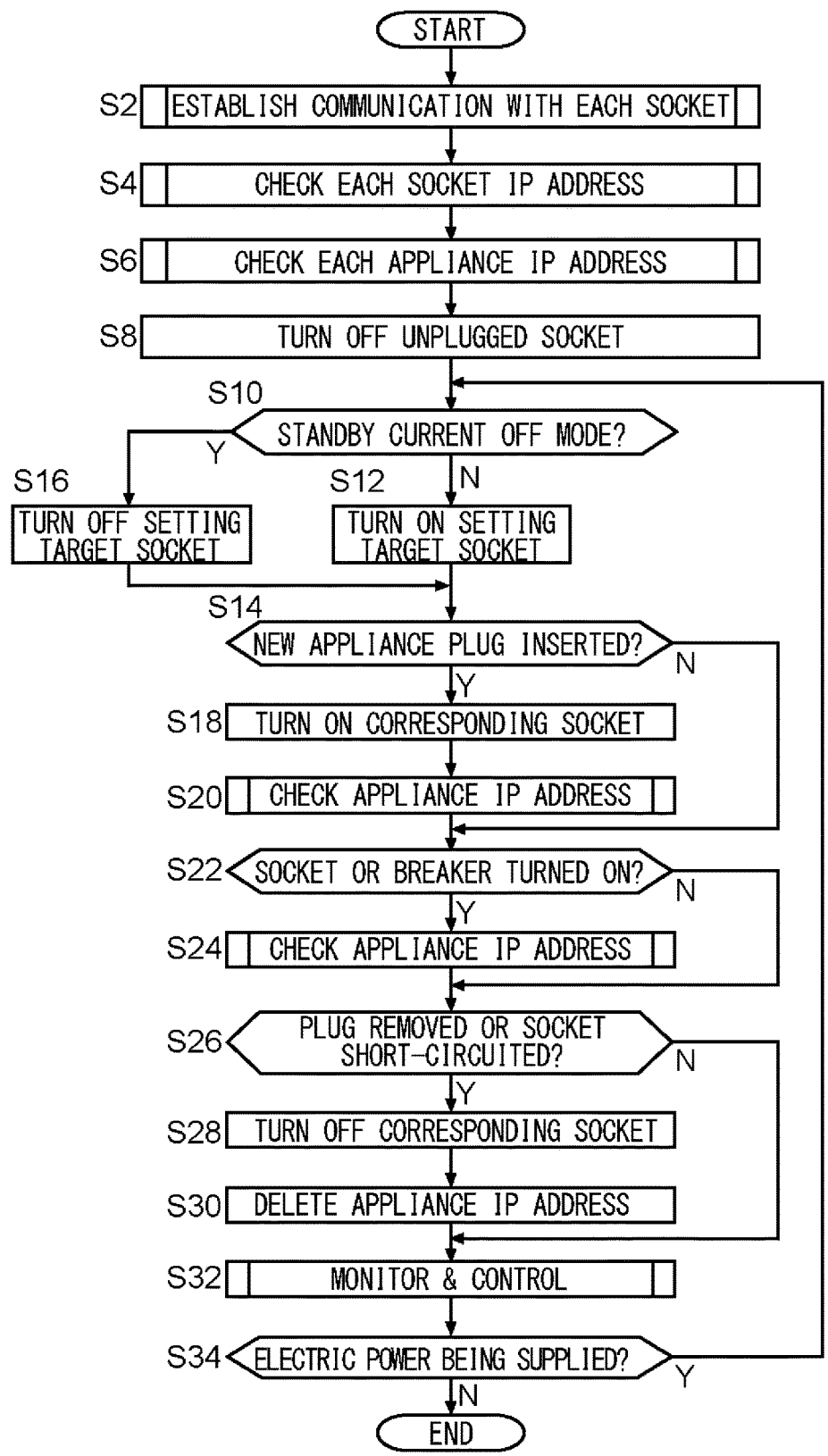
FIG. 4 is a principal flow chart showing the operation of an overall controller in each example.

FIG. 4 is a principal flow chart illustrating the operation of the overall controller 10 in Examples 1 to 3. The flow starts when the power section 4 or 72 starts to be supplied with electric power from the commercial power supply 2. At step S2, a procedure for establishing communication with sockets is performed. Next, at step S4, a process for checking the IP addresses of those sockets is performed, and then, at step S6, a process for checking the IP addresses of appliances is performed; then an advance is made to step S8. Step S6 includes a process for manually assigning, for an appliance having no IP address, an ID of the appliance as the IP address of a socket.

At step S8, any socket in which no plug is found to be inserted is turned off. Next, at step S10, whether or not a standby current off mode has been invoked is checked, and if not, at step S12, a setting target socket is turned on; then an advance is made to step S14. For any setting target socket that is on from the beginning, nothing is done at step S12, and an advance is made to step S14. On the other hand, if, at step S10, the standby current off mode is found to have been invoked, an advance is made to step S16, where a setting target socket is turned off, and an advance is made to step S14.

At step S14, it is checked whether or not a plug of an appliance has newly been inserted in any socket in which no socket had previously been inserted. On detecting a newly inserted plug, at step S18, the socket is turned on; then, at step S20, a process for checking the IP address of the appliance is performed, and then an advance is made to step S22. If, at step S14, no newly inserted plug of an appliance is detected, then a jump is made to step S22.

At step S22, it is checked whether or not any socket has been turned on that had previously been off despite a plug being inserted in it. On detecting a socket having been turned on, at step S24, a process for checking the IP address of the corresponding appliance is performed, and then an advance is made to step S26. On the other hand, if, at step S22, no socket is found to have been turned on, a jump is made to step S26. At step S22, it is also checked whether or not any breaker that governs a plurality of power outlets and sockets together has been turned on so that, on detecting a breaker having been turned on, then, at step S24, as when a socket has been turned on, a process for checking the IP addresses of the corresponding appliances governed by the breaker is performed, and then an advance is made to step S26.

At step S26, based on the monitoring signal from a current sensor, it is checked whether or not there is any socket at which the monitored electric current has remained zero for a predetermined length of time or longer and thus a plug is considered to have been removed, or any socket at which the monitored electric current is higher than the rated value and thus a fault such as a short-circuit is considered to have occurred. On detecting a zero current for the predetermined length of time or longer, or on detecting a current higher than the rated value, an advance is made to step S28, where the socket is turned off. Next, at step S30, the IP address of the appliance that has been inserted in the socket is deleted from memory, and an advance is made to step S32. On the other hand, if, at step S26, neither zero current for the predetermined length of time or longer nor a current higher than the rated value is detected, a jump is made to step S32.

At step S32, a process for monitoring and controlling sockets based on current sensors, the power meter, etc. is performed, and then an advance is made to step S34. At step S34, it is checked whether or not electric power is being supplied from the commercial power supply 2 to the power section 4 or 72 so that, if so, a return is made to step S10, where, so long as electric power continues being supplied, steps S10 through S34 are repeated to cope with various changes in situation. If, at step S34, electric power is found to have stopped being supplied, the flow ends.

Figure 5:
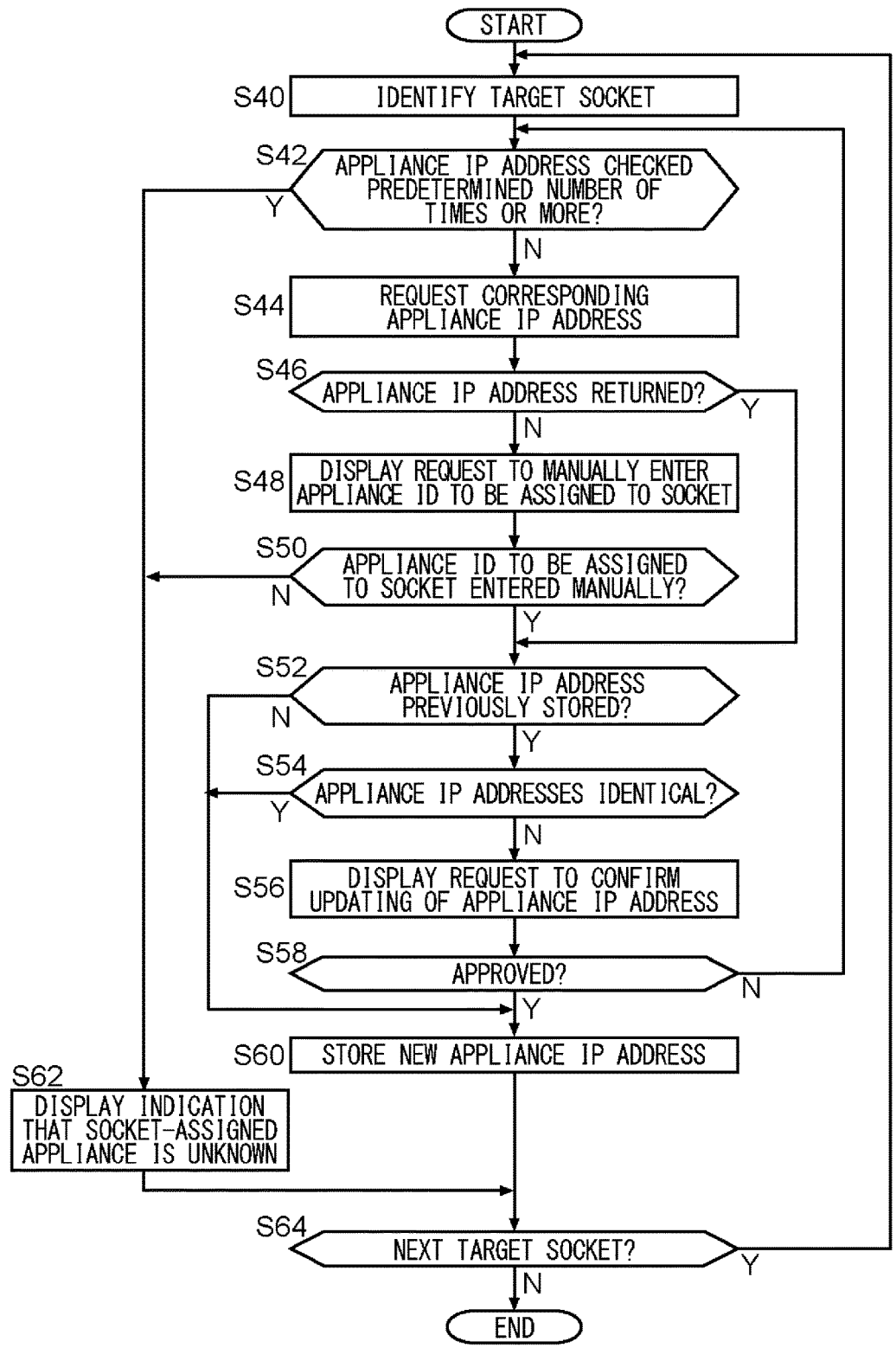
FIG. 5 is a flow chart showing the details of steps S6, S20, and S24 in FIG. 4.

FIG. 5 is a flow chart showing the details of the appliance IP address checking process in steps S6, S20, and S24 in FIG. 4. When the flow starts, at step S40, one socket is identified as a target. Then, at step S42, whether or not an appliance IP address check has been done a predetermined times or more is checked so that, if it has been done the predetermined times or less, an advance is made to step S44, where an IP address is requested from an appliance that is connected to the socket. Next, at step S46, whether or not an IP address is returned from the appliance is checked, and, if not, the appliance is recognized as one having no IP address, and an advance is made to step S48. At step S48, an indication prompting manual entry of an appliance ID to be assigned to the socket is shown on the display 16, and then, at step S50, whether or not an appliance ID to be assigned to the socket is manually entered in response is checked. If one is manually entered, an advance is made to step S50. If, at step S46, an IP address is returned from the appliance, a jump is made to step S52.

At step S52, whether or not any appliance IP address has already been stored in the storage 13 is checked. If there is any stored IP address, then an advance is made to step S54, where the newly returned IP address is compared with the stored IP address to check whether or not they are identical. If not, then at step S56, an indication prompting approval of updating of the appliance IP address is displayed, and, at step S58, whether or not an approving operation is done within a predetermined length of time is checked. On detecting an approving operation, an advance is made to S60. On the other hand, if, at step S52, no appliance IP address is found to be stored, a jump is made to step S60. Also if, at step S54, the newly retuned IP address is fond to be identical with the stored IP address, a jump is made to step S60. By contrast, if, at step S58, no approving operation is done within the predetermined length of time, a return is made to step S42, where whether or not the appliance IP address check has been done the predetermined number of times or more is checked. So long as the appliance IP address check has been done the predetermined number of times or less, steps S42 through step S58 are repeated.

At step S60, the new appliance IP address is stored, and then an advance is made to step S64. In the process at step S60, namely "STORE NEW APPLIANCE IP ADDRESS", it can occur that the same IP address as the one stored previously is stored anew, with no apparent change in what is stored. On the other hand, if, at step S42, the appliance IP address check has been done the predetermined number of times or more, then an advance is made to step S62, where an indication to the effect that the appliance connected to the socket in question is unknown is displayed on the display 16, and an advance is made to step S64. At step S64, whether or not there is any next socket on which to make the check is checked, and, if any, a return is made to step S40, where the same sequence is repeated for the next target socket. By contrast, if, at step S64, there is no next target socket, the flow ends, and an advance is made to step S8, S22, or S26 in FIG. 4.

Figure 6:
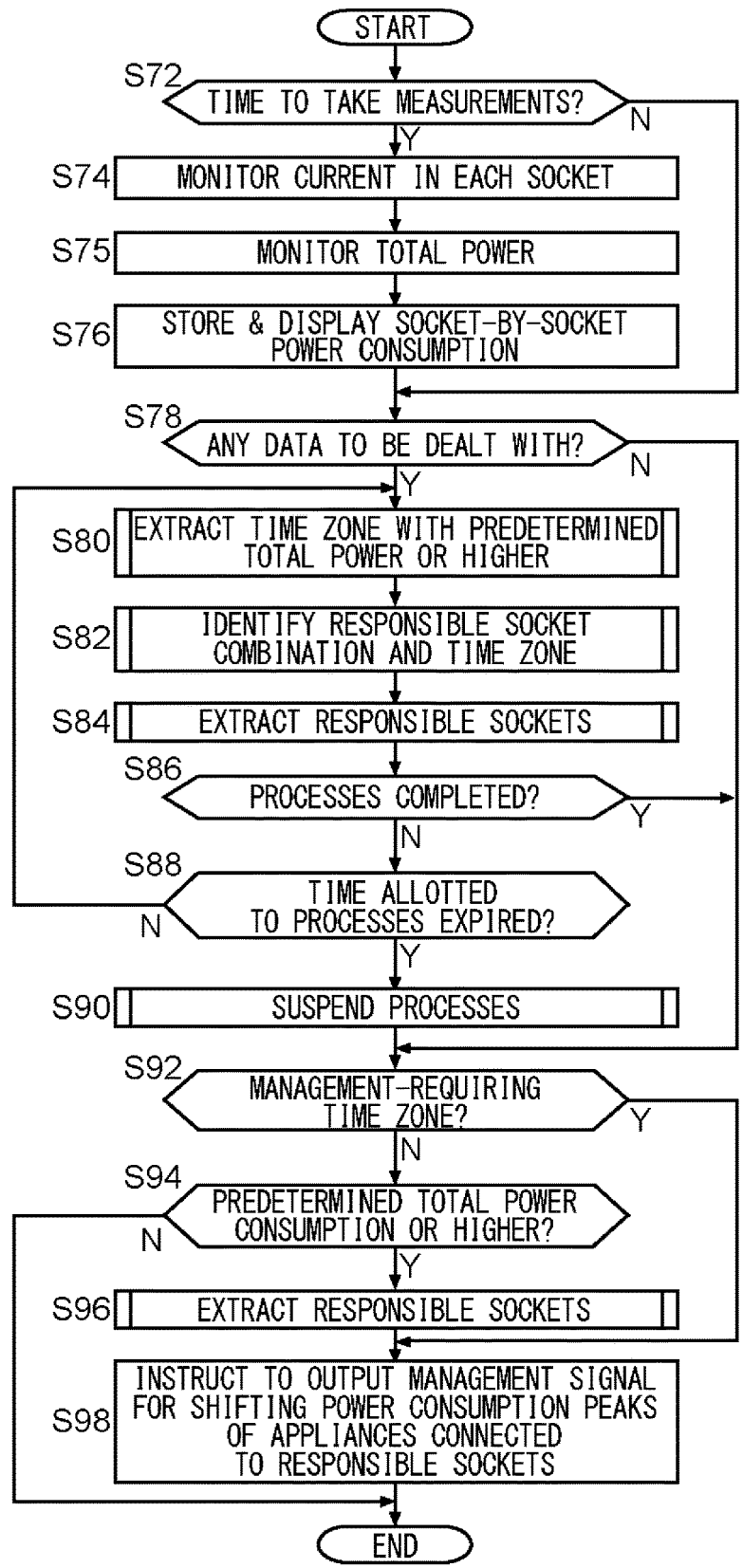
FIG. 6 is a flow chart showing the details of step S32 in FIG. 4.

FIG. 6 is a flow chart showing the details of the monitoring/controlling process at step S32 in FIG. 4. When the flow starts, at step S72, whether it is time to take a measurement is checked; if so, at step S74, the electric current at each socket is measured, and at step S75, the total electric power at that time is read from the power meter 6. Then, at step S76, based on the total electric power and the current at each socket, appliance-by-appliance electric power consumption is calculated, and the results are stored in the storage 13 and are displayed on the display 16; then an advance is made to step S78. In this way, it is possible to "visualize" appliance-by-appliance electric power consumption. On the other hand, if, at step S72, it is not time to take a measurement, a jump is made to step S78.

At step S78, based on changes in socket-by-socket electric power consumption and in total electric power, it is checked whether or not any data has arisen that needs to be dealt with. This check corresponds to a check for a time zone in which, a frequency at which, a trend with which, etc., total electric power consumption is high. If any such data is found, an advance is made to step S80, where a process for extracting a time zone in which total electric power consumption becomes equal to or higher than a predetermined level is performed. Next, at step S82, based on information from current sensors, an analyzing process is performed to identify a combination of sockets (hereinafter referred to as responsible sockets) that causes a rise in total electric power consumption and a time zone in which such a rise is observed. Then, at step S84, a process for extracting responsible sockets is performed, and an advance is made to step S86. The processes at steps S80, S82, and S84 are not performed up to their completion; they are suspended at the lapse of a predetermined period, and an advance is made to the next step.

At step S86, it is checked whether or not the processes at steps S80, S82, and S84 all have been performed up to their completion, and if not, an advance is made to step S88. At step S88, it is checked whether or not the processing times currently allotted to steps S80, S82, and S84 have expired, and if so, then an advance is made to step S90, where a procedure for suspending the processes is performed, and an advance is made to step S92. On the other hand, if, at step S88, the processing times currently allotted to steps S80, S82, and S84 have not expired, a return is made to step S80, so that the processes at steps S80, S82, and S84 are repeated on a time division basis until the allotted times expire. If, at step S86, it is found that the processes at steps S80, S82, and S84 all have been completed, a jump is made to step S92. If, at step S90, the procedure for suspending the processes is performed, then, when step S32 is reached next time in FIG. 4, the processes are restarted. If, at step S78, no data is found that needs to be dealt with, a jump is made to step S92.

At step S92, it is checked whether or not a management-requiring time zone (a time zone in which the total electric power consumption is supposed to rise) has set in. If not, an advance is made to step S94, where whether or not the total electric power consumption is equal to or higher than a predetermined level is checked. If so, an advance is made to step S96, where responsible sockets are extracted, and an advance is made to step S98. On the other hand, if, at step S92, a management-requiring time zone has set in, data of responsible sockets based on previous analysis is adopted, and an advance is made to step S98. In this way, even outside a management-requiring time zone that is expected based on previously analysis, whenever the total electric power consumption becomes equal to or higher than a predetermined level, it is dealt with by extracting responsible sockets at step S96.

At step S98, the appliances connected to responsible sockets are managed in a comprehensive fashion, and a management signal instructing to shift the peaks of electric power consumption is fed to the appliances; then, the flow ends. On the other hand, if, at step S94, the total electric power consumption is not equal to or higher than the predetermined level, the flow ends immediately.

Example 4

Figure 7:
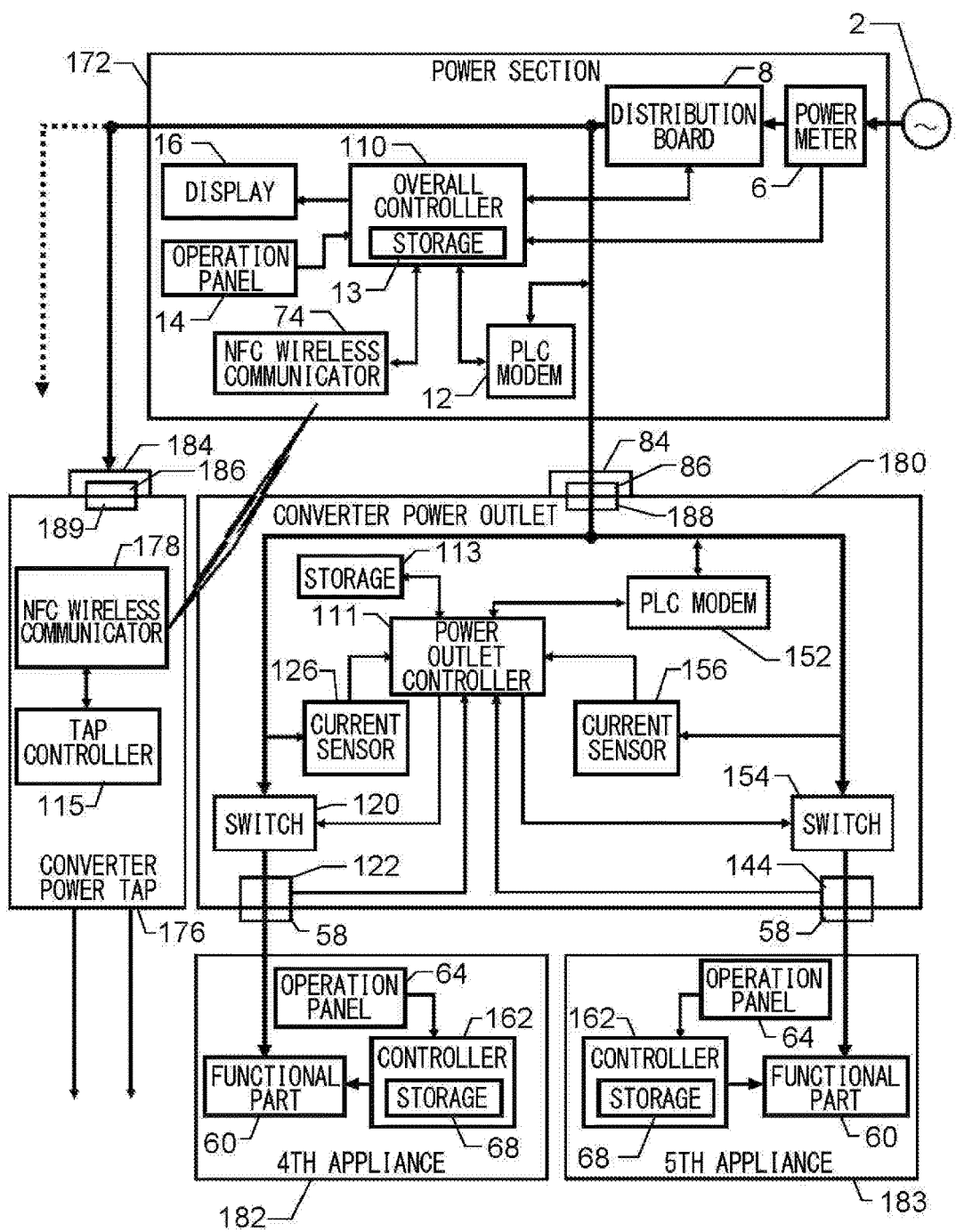
FIG. 7 is a system diagram showing an overall configuration of Example 4 of the present invention (Example 4)

FIG. 7 is a block diagram showing an overall configuration of still another embodiment, Example 4, of the present invention. Example 4 too constitutes a power outlet system in a household. Example 4 in FIG. 7 has much in common with Examples 1 to 3 in FIGS. 1 to 3; accordingly, the same parts are identified by common reference signs, and no overlapping description will be repeated unless necessary. Example 4 differs from Examples 1 to 3 in that appliances involved are ordinary appliances incapable of IP address-based communication or automatic control, and that their monitoring and control are achieved via converter power outlets or converter power taps. Here, as will be described later, an appliance can be controlled only in terms of turning on and off of the supply of electric power.

The configuration will now be described specifically with reference to FIG. 7. In Example 4, a power section 172 includes, as means for communication, both a PLC modem 12 and an NFC wireless communicator 74, and accordingly an overall controller 110 functions in a slightly different manner; in other respects, the power section 172 is similar to the power section 72 in Example 3 in FIG. 3; accordingly, equivalent parts are identified by common reference signs, and no overlapping description will be repeated. A fourth appliance 182, which is an ordinary appliance, has no control plug 66 for communication, like the one shown in FIG. 3, and accordingly a controller 162 is not configured to allow automatic control by communication and has a simplified configuration to provide control the functions of the appliance per se. In other respects, the fourth appliance 182 has a similar configuration as in Example 3 in FIG. 3; accordingly, equivalent parts are identified by common reference signs, and no overlapping description will be repeated. A fifth appliance 183 has a similar configuration as the fourth appliance 182; accordingly, equivalent parts are identified by common reference signs, and no overlapping description will be repeated.

Like the converter power outlet 80 in Example 3 in FIG. 3, a converter power outlet 180 is configured such that a plug 188 of the converter power outlet 180 is inserted in a socket 86 in an ordinary power outlet 84. This converts the ordinary power outlet 84 into a controllable power outlet, thereby making it possible to grasp the electric power consumption by the fourth and fifth appliances 182 and 183 connected respectively to sockets 122 and 144 in the converter power outlet 180.

Specifically, the converter power outlet 180 receives electric power from the distribution board 8 via the plug 188, and outputs it from the sockets 122 and 144 via switches 120 and 154 respectively. A PLC modem 152 in the converter power outlet 180 splits a control signal transmitted from the overall controller 10 by power-line communication, and based on a power outlet specifying signal contained in the control signal, turns on and off the switches 120 and 154. The significance of this function will be understood based on Examples 1 to 3 in FIGS. 1 to 3, and therefore no detailed description will be repeated.

A current sensor 126 monitors an electric current passing via the socket 122, and transmits a monitoring signal to the power section 172 via the PLC modem 152 by power-line communication. In the power section 172, the overall controller 10 receives the monitoring signal split by the PLC modem 12. Likewise, a current sensor 156 monitors an electric current passing via the socket 144, and transmits a monitoring signal to the power section 172 via the PLC modem 152 by power-line communication. The use of a monitoring signal received by the overall controller 110 will be understood based on the description given in connection with Examples 1 to 3 in FIGS. 1 to 3, and therefore no detailed description will be repeated.

The power outlet controller 111 accumulates a history of values of the electric currents monitored by the current sensors 126 and 156 respectively and, by analyzing them, infers what appliances are connected to the corresponding sockets 122 and 144 respectively. The inference is based on, with respect to the current values accumulated in a storage 113, a current value factor such as a maximum current value monitored, current variation width, or current variation pattern, or a time factor such as a current-consuming time zone or current-consuming frequency, or a combination of at least one from each category. Details will be given later.

A converter power tap 176 is configured similarly to the converter power outlet 180 except that the former achieves communication with the power section 172 by near-field communication (NFC) as in Example 3 in FIG. 3, and accordingly, here, only an NFC wireless communicator 178, which communicates with the NFC wireless communicator 74, and a tap controller 115 are illustrated, with all the other components omitted. Like the converter power outlet 180, the converter power tap 176, when its plug 189 is inserted in a socket 186 in an ordinary power outlet 184, converts the ordinary power outlet 184 as if a controllable power tap is extended from it. By inserting appliance plugs (unillustrated) in sockets (unillustrated) in the converter power tap 176, it is possible to grasp the electric power consumption of those appliances, and to turn on and off the supply of electric power to them. Although in Example 4 in FIG. 7, the converter power outlet 180 achieves communication by PLC and the converter power tap 176 achieves communication by NFC, this is not meant as any limitation; the converter power outlet 180 and the converter power tap 176 can achieve communication the other way around, or they can both achieve communication by either PLC or NFC; either converter power outlets 180 alone or converter power taps 176 alone can be connected to both the converter power outlet 180 and the converter power tap 176.

Figure 8:
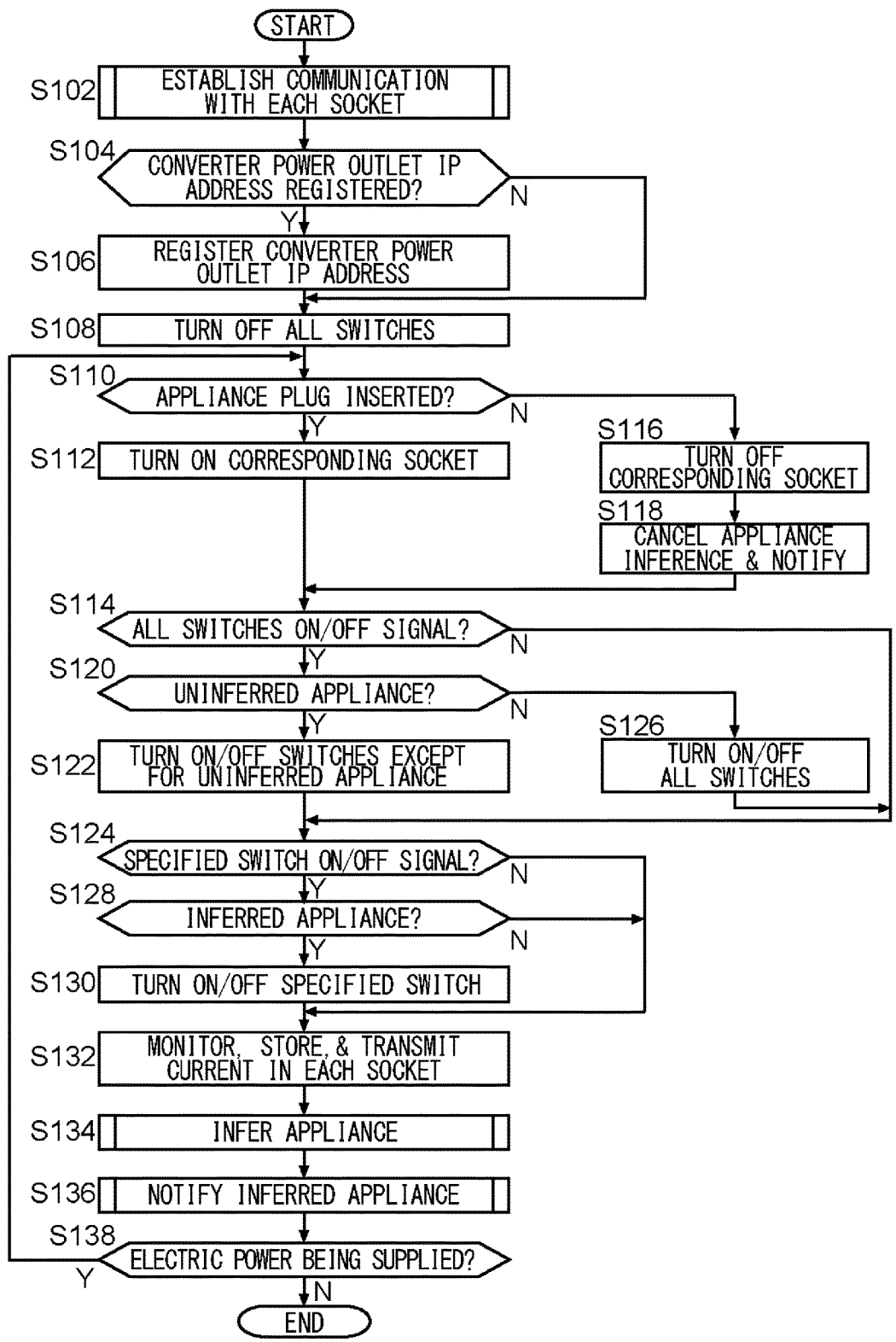
FIG. 8 is a principal flow chart illustrating the operation of a converter power outlet controller in Example 4.

FIG. 8 is a principal flow chart illustrating the operation of the power outlet controller 111 in the converter power outlet 180 in Example 4 in FIG. 7. When a plug 188 of the converter power outlet 180 is inserted in a socket 86 in the ordinary power outlet 84, and as a result electric power starts to be supplied to the converter power outlet 180, the flow starts. At step S102, a procedure for establishing communication with the overall controller 110 in the power section 172 is performed. Subsequently, at step S104, whether or not the IP address of the converter power outlet 180 has already been registered in the storage 13 in the overall controller 110 is checked. If not, an advance is made to step S106, where the IP address is registered through communication with the overall controller 110, and then an advance is made to step S108. If the IP address has already been registered, a jump is made to step S108. At step S108, to set up an initial state, all switches in the converter power outlet 180 (in FIG. 7, the switches 120 and 154) are turned off, and an advance is made to step S110.

At step S110, whether or not a plug of an appliance is inserted in a socket is checked. If a plug is found to be inserted, an advance is made to step S112, where the switch corresponding to that plug is turned on, and an advance is made to step S114. On the other hand, if, at step S110, no plug of an appliance is found to be inserted in a socket, an advance is made to step S116, where the corresponding switch is turned off, and then, at step S118, a notice to the effect that appliance inference has been canceled is conveyed to the overall controller 110. If there is a history of no insertion of an appliance plug having been detected in the previous check and no insertion ever since, nothing is done at step S118, and an advance is made to step S114. For simplicity's sake, FIG. 8 only shows the operation with respect to one socket; in practice, for one socket after another, steps S110, S112, S116, and S118 are repeated, and when the checks for all sockets are confirmed to be complete, an advance is made to step S114.

At step S114, it is checked whether or not a signal instructing to turn on or off all switches corresponding to every socket in the converter power outlet 180 has been received from the overall controller 110. If the signal is found to have been received, an advance is made to step S120, where it is checked whether or not there is any appliance that has not yet been inferred to be what appliance. If there is any such appliance, an advance is made to S122, where except any switch corresponding to an uninferred appliance, all switches are turned on or off as instructed, and an advance is made to step S124. The aim is to avoid the inconvenience of the supply of electric power being turned on or off uniformly with no regard to whichever appliance is unidentified. On the other hand, if, at step S120, it is confirmed that there is no uninferred appliance, an advance is made to step S126, where all switches are turned on or off as instructed, and an advance is made to step S124. If, at step S114, no signal instructing to turn on or off all switches is found to have been received, a jump is made to step S124.

At step S124, it is checked whether or not a signal specifying a particular switch and instructing to turn on or off that switch has been received from the overall controller 110. If the signal is found to have been received, an advance is made to step S128, where it is checked whether or not an appliance connected to a socket corresponding to the specified switch has already been inferred. If the appliance has already been inferred, an advance is made to step S130, where the specified switch is turned on or off as instructed, and an advance is made to step S132. On the other hand, if, at step S128, an appliance connected to a power outlet corresponding to the specified switch is not found to have been already inferred, a jump is made to step S132. The aim is to avoid the inconvenience of the supply of electric power to an appliance being turned on or off mechanically despite its being unidentified. If, at step S124, no signal specifying a particular switch and instructing to turn on or off that switch is not found to have been received, a jump is made to step S132.

At step S132, the electric currents passing through appliances connected via sockets are monitored on a time division basis, for a predetermined short period for each socket; their values are stored in a storage 113 in the converter power outlet 180 itself, and are transmitted to the overall controller 110 so as to be stored also in the storage 13 in it. As will be described later, so long as electric power is supplied to the converter power outlet 180, the part of the flow up to step S132 is repeated in a short while, and thus these processes of monitoring, storing, and transmitting current values are performed substantially constantly. After the lapse of a predetermined short period, an advance is made to step S132, where a process for appliance inference is performed; then, at, step S136, a process for appliance inference notification is performed, and an advance is made to step S138. The appliance inference process and the appliance inference notification process will be described in detail later.

At step S138, whether or not electric power is being supplied to the converter power outlet 180 is checked, and if so, a return is made to step S110; thereafter, unless electric power is detected not being supplied at step S138, steps S110 through S138 are repeated. This is to deal with insertion and removal of plugs on power outlets, signals for turning on and off switches, current monitoring, appliance inference, etc. On the other hand, if, at step S138, it is found that no electric power is being supplied, the flow ends.

While FIG. 8 shows the functions of the power outlet controller 111 in the converter power outlet 180 in FIG. 7, these functions can be thought of as the functions of the tap controller 115 in the converter power tap 176. In that case, the operation of the tap controller 115 will be understood when "converter power outlet" in FIG. 8 is read as "converter power tap".

Figure 9:
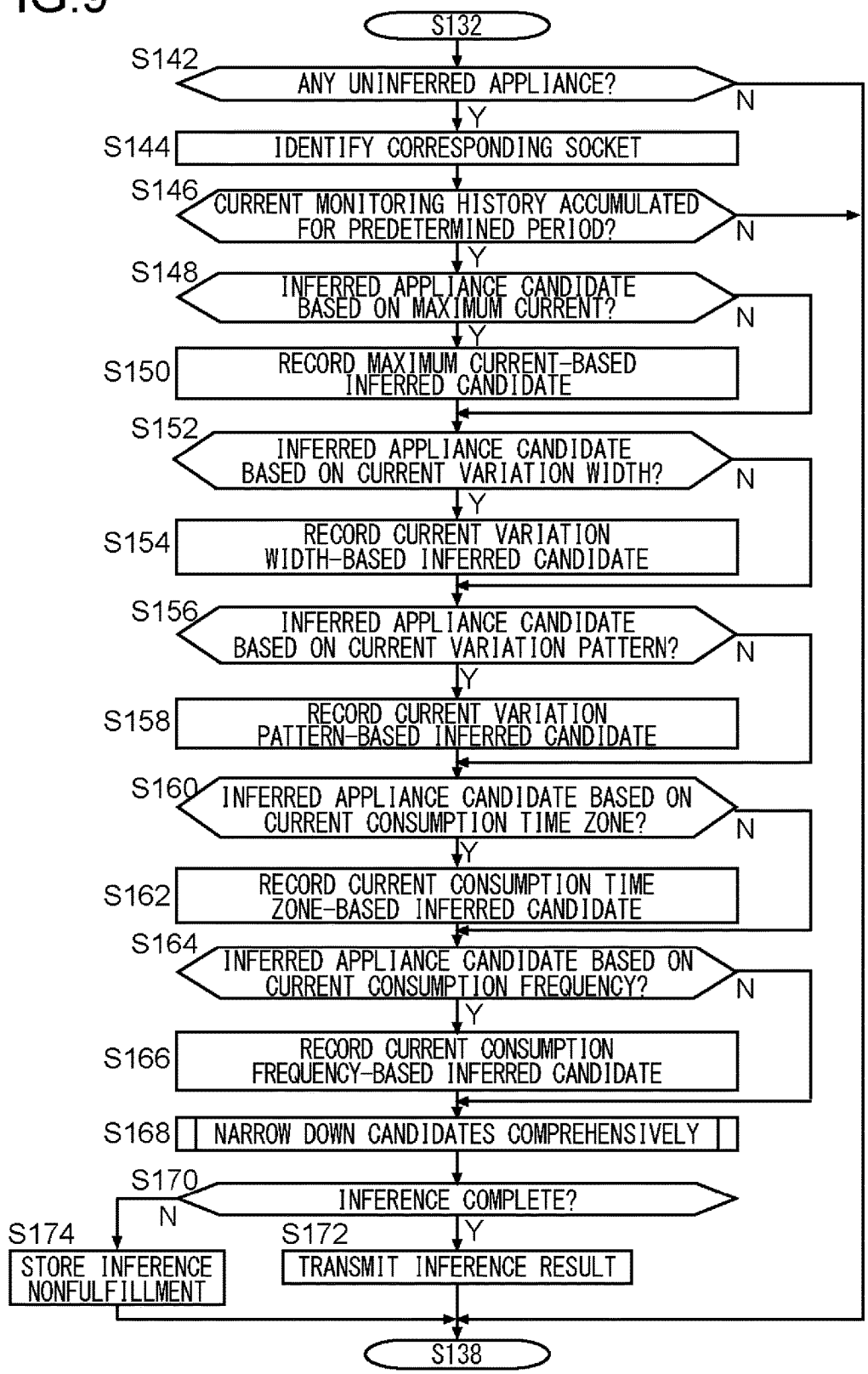
FIG. 9 is a flow chart showing the details of steps S134 and S136 in FIG. 8.

FIG. 9 is a flow chart showing the details of the appliance inference process at step S134 in FIG. 8 and the appliance inference notification process at step S136 in FIG. 8, steps S142 through S168 here corresponding to step S134 in FIG. 8, steps S170 through S174 here corresponding to the step S136 in FIG. 8. When, in the flow in FIG. 8, an advance is made from step S132 to step S134, the flow in FIG. 9 starts. First, at step S142, whether or not there is any uninferred appliance is checked. If there is any uninferred appliance, an advance is made to step S144, where one socket to which an uninferred appliance is connected is identified, and an advance is made to step S146. At step S146, it is checked whether or not a history of current monitoring has been accumulated for a predetermined period or longer with respect to the uninferred appliance that is connected to the identified socket. If a history of current monitoring is found to have been accumulated for a predetermined period or longer, an advance is made to step S148.

At step S148, the maximum current value in the current monitoring history of the appliance connected to the socket specified at step S144 is compared with a predetermined reference value to check whether or not, based on the maximum current value being equal to or higher than the reference value, a particular appliance can be inferred to be an appliance candidate that can consume such a maximum current. For example, one appliance candidate that can consume such a maximum current is an air conditioner. If there is any appliance that can be taken as a candidate, an advance is made to step S150, where it is recorded as a maximum current-based inferred candidate, and an advance is made to step S152. On the other hand, if, at step S148, no candidate can be inferred based on the maximum current value, a jump is made to step S152.

At step S152, in a similar manner, the current variation width in the current monitoring history of the appliance connected to the socket specified at step S144 is compared with a predetermined reference value to check whether or not, based on the current variation width being equal to or higher than the reference value, a particular appliance can be inferred to be an appliance candidate that exhibits such a current variation width. For example, one appliance candidate that can exhibit such a current variation width is an electric fan with variable wind speed. If there is any appliance that can be taken as a candidate, an advance is made to step S154, where it is recorded as a current variation width-based inferred candidate, and an advance is made to step S156. On the other hand, if, at step S152, no candidate can be inferred based on the maximum current value, a jump is made to step S156.

At step S156, in a similar manner, the current variation pattern in the current monitoring history of the appliance connected to the socket specified at step S144 is checked against a predetermined reference pattern to check whether or not, based on high similarity of the current variation pattern to the reference pattern, a particular appliance can be inferred to be an appliance candidate that exhibits a current variation pattern like the reference pattern. For example, one appliance candidate that can exhibit a distinctive current variation pattern is a refrigerator. If there is any appliance that can be taken as a candidate, an advance is made to step S158, where it is recorded as a current variation pattern-based inferred candidate, and an advance is made to step S160. On the other hand, if, at step S156, no candidate can be inferred based on the maximum current value, a jump is made to step S160.

Whereas in steps S148 through S158 described above, inferences are made based on current values and their variation in a situation where current consumption takes place on a continuous basis, in step S160 and the subsequent steps, appliances are inferred based on a relationship between presence or absence of current consumption and a time factor.

At step S160, a time zone in which current consumption occurs in the current monitoring history of the appliance connected to the socket specified at step S144 is checked against a predetermined reference time zone to check whether or not, based on current consumption occurring in the reference time zone, a particular appliance can be inferred to be an appliance candidate with which current consumption can occur in such a time zone. Specifically, if current consumption occurs around the clock, a candidate for such an appliance is, for example, a refrigerator; if current consumption occurs chiefly during the night, a candidate for such an appliance is, for example, an electric blanket. A time zone here can be not only a short period such as a day but also a season of the year. For example, if current consumption occurs chiefly in winter, the appliance cannot be an electric fan but can be a heating appliance such as an electric kotatsu (typically a leg warmer in the form of a low table covered with a blanket, with a heat source in it). If, at step S160, there is an appliance that can be taken as a candidate, an advance is made to step S162, where it is recorded as a time zone-based inferred candidate, and an advance is made to step S164. On the other hand, if, at step S160, no candidate can be inferred based on a time zone, a jump is made to step S164.

At step S164, in a similar manner, the frequency at which current consumption occurs in the current monitoring history of the appliance connected to the socket specified at step S144 is checked against a predetermined reference frequency to check whether or not, based on the frequency, a particular appliance can be inferred to be an appliance candidate. For example, if the frequency is about once a day, an appliance candidate is, for example, a washing machine or a vacuum cleaner. With a comparatively high frequency, an appliance candidate is, for example, a desk lamp. If, at step S164, there is an appliance that can be taken as a candidate, an advance is made to step S166, where it is recorded as a frequency-based candidate, and then an advance is made to step S168. On the other hand, if, at step S164, no candidate can be inferred based on a frequency, a jump is made to step S168.

At step S168, a process for narrowing down candidates in a comprehensive fashion is performed based on what has been stored about inferred candidates as a result of the checks at steps S142 through S166, and then an advance is made to step S170. Step S168 will be described in detail later. At step S170, whether or not an inference is complete is checked, and if so, then at step S172, the inferred result is transmitted to the overall controller 110 in the power section 172 to be stored in the storage 13 there; then an advance is made to step S138. In this way, the power section 172 can identify an appliance and monitor its current consumption, and also can identify an appliance and control the supply of electric power to it.

On the other hand, if, at step S170, no inference is found to be complete, an advance is made to step S174, where the fact that the appliance connected to the socket in question remains uninferred is stored in the storage 113, and an advance is made to step S138. If, at step S142, it is confirmed that there is no uninferred appliance, or if, at step S146, it is not found that a current monitoring history has been accumulated for a predetermined period or longer, a jump is made to step S138.

Figure 10:
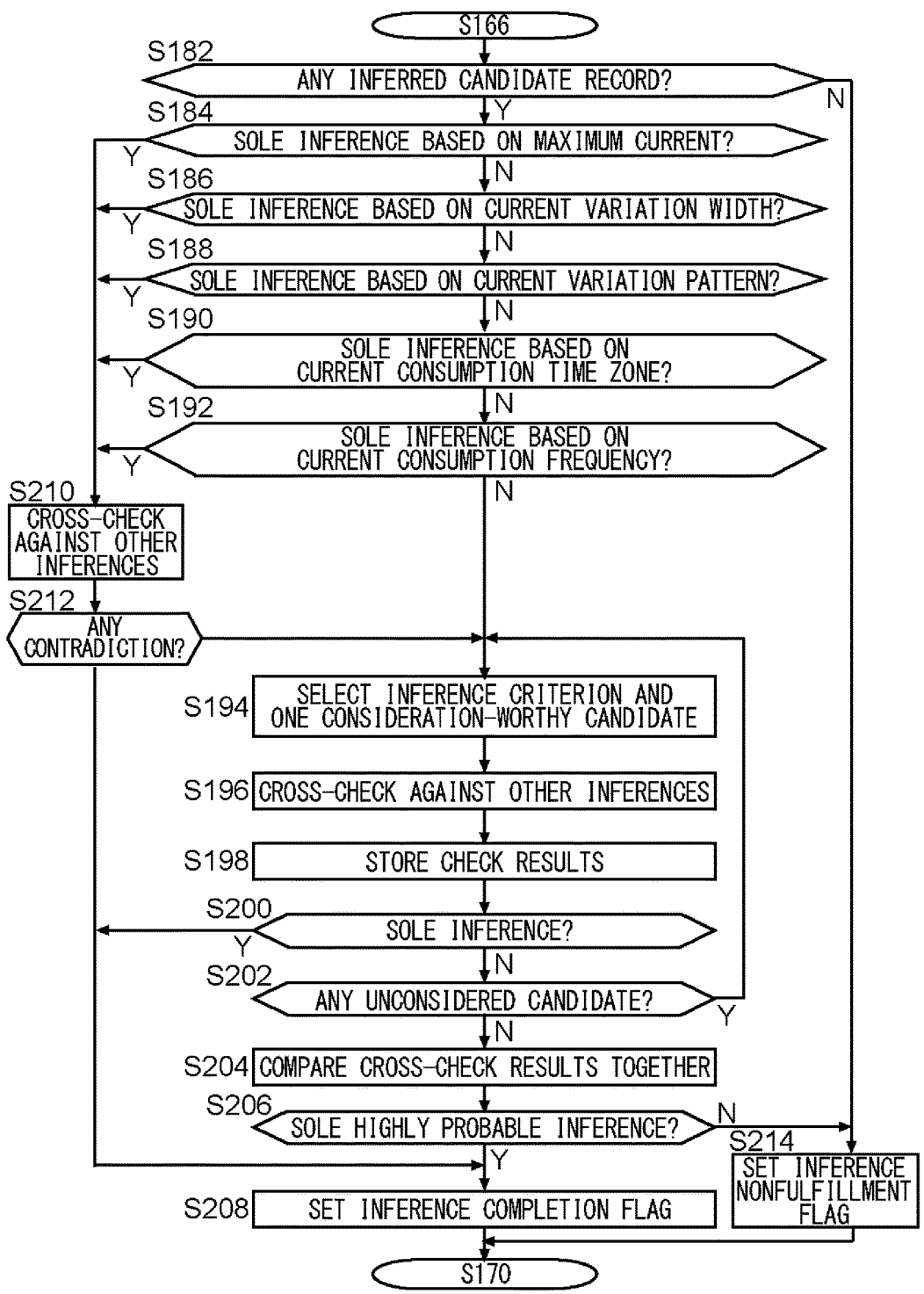
FIG. 10 is a flow chart showing the details of step S168 in FIG. 9.

FIG. 10 is a flow chart showing the details of the comprehensive narrowing-down process at step S168 in FIG. 9. When, in the flow in FIG. 9, an advance is made from step S166 to step S168, the flow shown in FIG. 10 starts. First, at step S182, whether or not there is any inferred candidate record is checked. If there is any inferred candidate record, an advance is made to step S184.

At step S184, based on the inferred candidate record, whether or not a sole appliance can be inferred based on a maximum current value is checked, and if not, an advance is made to step S186. At step S186, based on the inferred candidate record, whether or not a sole appliance can be inferred based on a current variation width is checked, and if not, an advance is made to step S188. At step S188, based on the inferred candidate record, whether or not a sole appliance can be inferred based on a current variation pattern is checked, and if not, an advance is made to step S190. At step S190, based on the inferred candidate record, whether or not a sole appliance can be inferred based on a current consumption time zone is checked, and if not, an advance is made to step S192. At step S192, based on the inferred candidate record, whether or not a sole appliance can be inferred based on a current consumption frequency is checked, and if not, an advance is made to step S194.

At step S194, out of a plurality of candidates based on one inference criterion, one is sorted out as a consideration-worthy candidate, and at step S196, this consideration-worthy candidate is subject to a cross-check based on another inference criterion. Then, at step S198, the result of the cross-check is stored. Next, at step S200, based on the cross-check result, whether or not the consideration-worthy candidate can be inferred to be the sole appliance is checked. If it cannot be inferred to be the sole appliance, then at step S202, whether or not there is any unconsidered candidate is checked. Just after a consideration-worthy candidate is sorted out for the first time, there has to remain at least one unconsidered candidate; thus, back at step S194, one unconsidered candidate is sorted out as a consideration-worthy candidate, and an advance is made to step S196. Thereafter, until it is found that a sole candidate has been inferred at step S200, or until it is confirmed that there remains no unconsidered candidate at step S202, steps S194 through S202 are repeated so that all consideration-worthy candidates based on all inference criteria are subjected to cross checks against each other.

If, at step S202, it is found that there is no unconsidered candidate, an advance is made to step S204. This means that no sole appliance has been inferred through cross-checks. Accordingly, at step S204, cross-check records are compared together to check whether or not there is any cross-check record that alone does not permit a sole appliance to be inferred but that, when compared with other cross-check records, permits a far more probable inference. Then, an advance is made to step S206, where it is checked whether or not there is any cross-check record that permits a highly probable inference, and if any, based on it, a sole appliance is inferred, and an advance is made to step S208.

On the other hand, if, at any of steps S184 through S192, a sole appliance can be inferred, an advance is made to step S210, where, for confirmation, cross-checks against other consideration-worthy candidates are made, and then at step S212, it is checked whether or not there is any contradiction among the check results. If there is no contradiction, an advance is made to step S208. On the other hand, if there is any contradiction, an advance is made to step S194, where, as in a case where no sole inference cannot be made in any of steps S184 through S192, the checks from steps S194 through S206 are gone through. On the other hand, if, at step S200, a sole inference can be made, an advance is made to step S208.

At step S208, an inference completion flag is set, and an advance is made to step S170 in FIG. 9, where whether or not an inference is complete is checked. On the other hand, if, at step S182, no inferred candidate record is found, or if, at step S206, the probability check at step S206 is reached with no sole appliance inferred, an advance is made to step S214, where an inference nonfulfillment flag is set, and then an advance is made to step S170, where whether or not an inference is completed is checked.

Example 5

Figure 11:
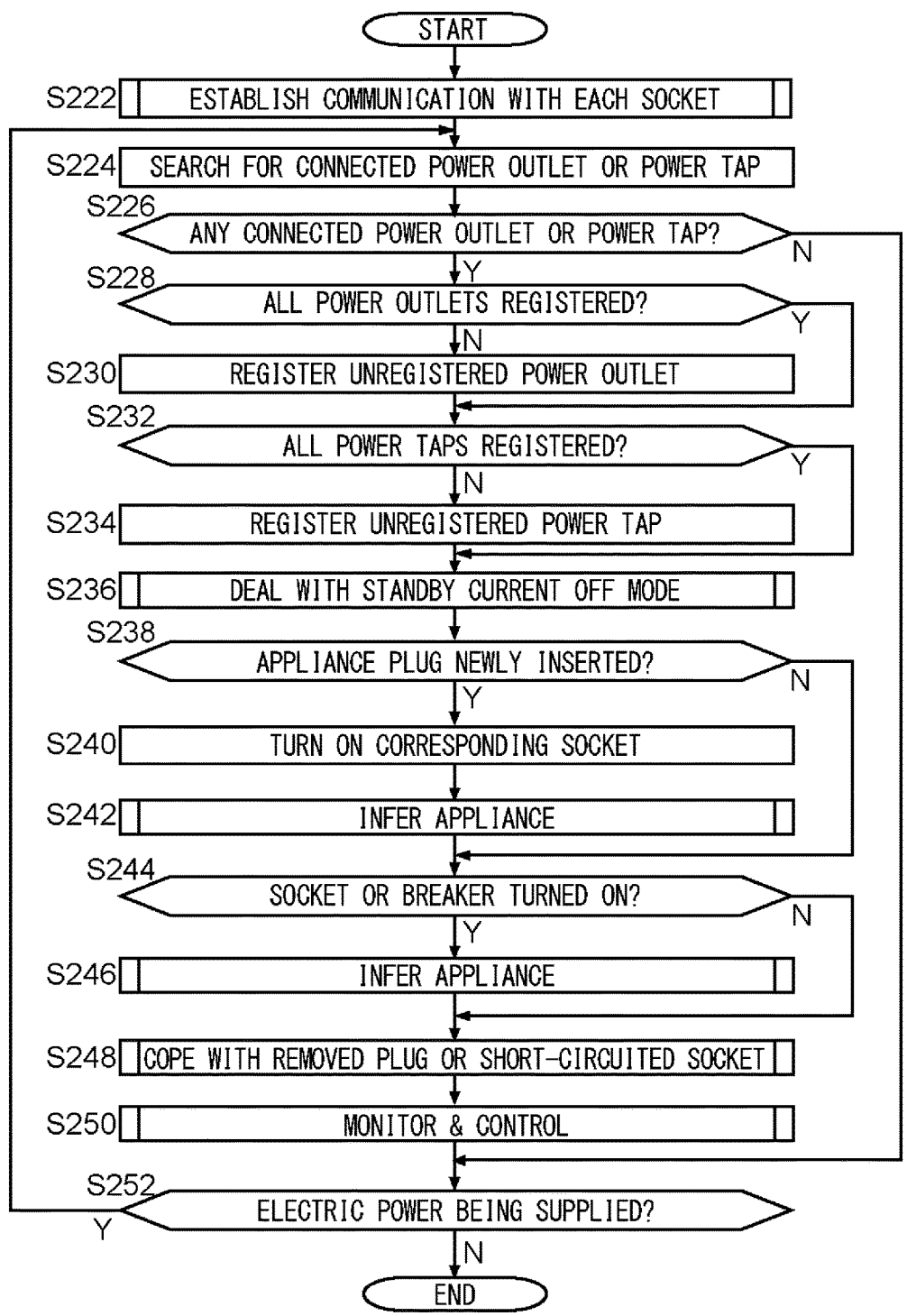
FIG. 11 is a principal flow chart illustrating the operation of an overall controller in a power section in Example 5 of the present invention (Example 5).

FIG. 11 is a principal flow chart illustrating the operation of the overall controller in the power section in still another embodiment, Example 5, of the present invention. Example 5 too constitutes a power outlet system in a household. The configuration here is in itself the same as in Example 4, and therefore it will be understood with additional reference to FIG. 7. Like Example 4, Example 5 presupposes ordinary appliances, that is, appliances that are incapable of either communication based on IP addresses or automatic control. Example 5 in FIG. 11 differs from Example 4, of which the operation is shown in FIGS. 8 to 10, in that, whereas in Example 4, an appliance is identified in a converter power outlet or a converter power tap, in Example 5, an appliance is identified in the power section 172. In other respects, Example 5 is similar to Example 4, and therefore it can be understood, except for the appliance inference process shown in FIG. 11, by way of the operation of the overall controller 110 in Example 4.

The flow in FIG. 11 starts when electric power starts to be supplied from a commercial power supply to the power section 172. At step S222, a procedure for establishing communication with sockets is performed. Next, at step S224, a search is made for any converter power outlet and converter power tap that are connected. Then, based on the results of the search, at step S226, whether or not there is any connected converter power outlet or converter power tap is checked. If there is any converter power outlet or converter power tap, an advance is made to step S228, where, first, whether or not all converter power outlets have been registered is checked. If there is any unregistered converter power outlet, then at step S230, it is registered, and an advance is made to step S232. On the other hand, if, at step S228, all converter power outlets are found to have been registered, a jump is made to step S232. At step S228, also if there is no connected converter power outlet at all, it is regarded that there is no unregistered converter power outlet, and an advance is made to step S232.

At step S232, based on the check at step S226 for any connected converter power outlet or converter power tap, whether or not all converter power taps have been registered is checked. If there is any unregistered converter power tap, then at step S234, it is registered, and an advance is made to step S236. On the other hand, if, at step S232, all converter power taps are found to have been registered, a jump is made to step S236. As at step S228, at step S232, if there is no connected converter power tap at all, it is regarded that there is no unregistered converter power tap, and an advance is made to step S236.

At step S236, for every converter power outlet and converter power tap, a standby current control process is performed. What is done in this process is identical with what is done at steps S10, S12, and S16 in FIG. 4. Then, an advance is made to step S238, where it is checked whether or not a new appliance plug has been inserted in a converter power outlet or converter power tap. If a plug is detected having been inserted, an advance is made to step S240, where a signal for turning on the corresponding socket is transmitted, and an advance is made to step S242.

In Example 5, a history of values of the electric currents monitored by current sensors as transmitted from converter power outlets and converter power taps is accumulated in the storage 13 in the overall controller 110. At step S242, the current sensor history accumulated in the storage 13 is analyzed to infer appliances connected to sockets in converter power outlets and converter power taps, and then an advance is made to step S244. What is specifically done as the inference process at step S242 is basically the same as the operation shown in FIGS. 9 and 10, and a difference is that, whereas in Example 9, the process is performed locally in each converter power outlet and converter power tap, in Example 10, it is performed in the overall controller 110. In a caser where the appliance inference process is performed in the power section as shown in FIG. 11, step S172 in FIG. 9 is read as "STORE & DISPLAY INFERENCE", and step S174 is read as "STORE & DISPLAY INFERENCE NON-FULFILLMENT". On the other hand, if, at step S238, no new appliance plug is detected having been inserted, a jump is made to step S244.

At step S244, it is checked whether or not any socket or breaker is detected being on. This process is similar to what is done at step S22 in FIG. 4. If any is detected, an advance is made to step S246, where the appliance inference process is performed, and an advance is made to step S248. What is done at step S246 is similar to what is done at step S242, and is basically the same as the operation shown in FIGS. 9 and 10. On the other hand, if, at step S244, no socket or breaker is detected being on, a jump is made to step S248.

At step S248, a process for dealing with a removed plug or a short-circuited socket is performed. What is done here is similar to what is done at steps S26 to S30 in FIG. 4. Next, at step S250, a process for monitoring electric currents in sockets and controlling the supply of electric current is performed, and an advance is made to step S252. What is done at step S250 is the same as that described in connection with step S32 in FIG. 4. If, at step S226, no connected converter power outlet or converter power tap is detected, a jump is made to step S252.

At step S252, whether or not electric power is being supplied from a commercial power supply to the power section 172 is checked, and if so, a return is made to step S224, and thereafter, so long as electric power continues being supplied, steps S224 through S252 are repeated to deal with various changes in situation. If, at step S252, electric power is detected having stopped being supplied, the flow ends.

<Overview>

To follow is an overview of various aspects of the invention disclosed herein.

An invention disclosed herein provides a power management system which includes: a power supplier; a power meter which detects the total power consumption of electric power supplied from the power supplier; a plurality of current sensors which detect electric currents passing respectively through a plurality of power consumers connected to the power supplier; and a controller which calculates power consumption by each of the plurality of power consumers based on the power meter and the plurality of current sensors. This makes it possible to calculate, with a simple configuration, the electric power consumption of each power consumer individually.

According to a specific feature of the invention disclosed herein, the plurality of current sensors are provided respectively for sockets in power outlets to which the power consumers are connected. This makes it possible to calculate the electric power consumption of power consumers by managing the power outlets to which they are connected.

According to another specific feature of the invention disclosed herein, the controller controls the supply of electric power to each of the sockets. This makes it possible to prevent unnecessary supply of electric power, and to prevent accidents, through management from the controller.

According to another feature of the invention disclosed herein, a power outlet is provided with includes: a socket to which electric power is supplied from a power supplier; a current sensor which detects an electric current passing via the socket through a power consumer connected to the socket; and a transmitter which transmits the result of current detection by the current sensor to the power supplier. This makes it possible to acquire information useful for power management on a socket-by-socket basis easily.

According to a specific feature, the transmitter transmits, to the power supplier, identifying information by which a power consumer connected to the socket is identified. This makes it possible to manage a power consumer connected to a power outlet by managing the power outlet to which it is connected.

According to another specific feature, the transmitter transmits, to the power supplier, information on whether or not a power consumer is connected to the socket. This makes it possible to prevent unnecessary supply of electric power, and to prevent accidents, through management from the power supplier.

According to another specific feature, the power outlet further includes a switch which turns on and off the socket based on control from the power supplier. This makes it possible to prevent unnecessary supply of electric power, and to prevent accidents, through management from the power supplier.

According to another specific feature, the power outlet feeds a control signal to a power consumer connected to the socket based on control from the power supplier. This permits the power supplier to mange power consumers in a comprehensive fashion.

According to another feature of the invention disclosed herein, a power outlet is provided with includes: a socket to which electric power is supplied from a power supplier; and a switch which turns on and off the socket based on control from the power supplier.

According to another feature of the invention disclosed herein, a power outlet is provided with includes: a socket to which electric power is supplied from a power supplier; and a transmitter which transmits, to the power supplier, identifying information by which a power consumer connected to the socket is identified.

According to another feature of the invention disclosed herein, a power outlet is provided with includes: a socket to which electric power is supplied from a power supplier; and a feeder which feeds a control signal to a power consumer connected to the socket based on control from the power supplier.

Another invention disclosed herein provides a power management system which includes: a plurality of current sensors which detect electric currents passing respectively through a plurality of power consumers to which electric power is supplied; and a controller which infers kinds of the plurality of power consumers based on the electric currents detected respectively by the plurality of current sensors. This makes it possible to control, and to monitor the electric power consumption of, appliances with due discrimination among them, even with appliances that are incapable of being controlled or being monitored for electric power consumption.

According to a specific feature of the invention disclosed herein, the power management system further includes a power supplier which supplies electric power to the power consumers, and the controller is provided in the power supplier. In this case, appliances are inferred in the power supplier in a comprehensive fashion. On the other hand, according to another feature of the invention disclosed herein, the power management system further includes a power outlet unit which receives electric power and which includes a plurality of sockets to which the plurality of power consumers are connectible and a plurality of switches which control the supply of electric power to the sockets respectively. Here, the current sensors and the controller are provided in the power outlet unit. In this case, appliances are inferred in each power outlet unit. The power outlet unit is specifically, for example, a converter power outlet, converter power tap, or the like.

According to another specific feature, the controller infers the kinds of the power consumers based on variation of the electric currents passing through the power consumers. For example, the controller infers the kinds of the power consumers based on one of, or a combination of two or more of, a maximum current, a current variation width, and a current variation pattern with respect to the electric currents passing through the power consumers.

According to another specific feature, the controller infers the kinds of the power consumers based on a time factor with respect to the electric currents passing through the power consumers. For example, the controller infers the kinds of the power consumers based on one of, or a combination of, a current consumption time zone and a current consumption frequency with respect to the electric currents consumed by the power consumers.

According to another feature of the invention disclosed herein, a power supplier is provided which includes a controller which infers, based on electric currents passing through a plurality of power consumers as targets to supply electric power to, the kinds of the power consumers. This makes it possible to control, and to monitor the electric power consumption of, appliances with due discrimination among them, even with appliances that are incapable of being controlled or being monitored for electric power consumption, and to infer appliances in the power supplier in a comprehensive fashion.

According to a specific feature, the controller in the power supplier infers the kinds of the plurality of power consumers based on the results of current detection as fed from external current sensors which respectively detect the electric currents passing through the plurality of power consumers. According to a further specific feature, the controller includes a storage which stores a history of changes in the electric currents as fed from the current sensors.

According to another feature of the invention disclosed herein, a power outlet unit is provided which includes: a plurality of sockets which are connectible to a power supplier and to which a plurality of power consumers are connectible; a plurality of switches which control the supply of electric power to the sockets respectively; a plurality of current sensors which respectively detect electric currents passing through the plurality of power consumers connected to the sockets; and a controller which infers the kinds of the plurality of power consumers connected respectively to the sockets based on the electric currents detected respectively by the plurality of current sensors. This makes it possible to control, and to monitor the electric power consumption of, appliances with due discrimination among them, even with appliances that are incapable of being controlled or being monitored for electric power consumption, and to infer appliances for each power outlet unit. The power outlet unit is specifically, for example, a converter power outlet, converter power tap, or the like.

According to a specific feature, the power outlet unit includes a communicator which transmits, to the current supplier, the results of detection of the electric currents detected respectively by the plurality of current sensors and which receives, from the current supplier, control signals for controlling the plurality of switches. This makes it possible to achieve proper coordination with the power supplier which supplies electric power to the power outlet unit.

According to a more specific feature, even when a control signal is received from the current supplier, the power outlet unit does not control a switch corresponding to a socket to which an uninferred power consumer is connected. This makes it possible to prevent improper control with an unidentified control target.

According to another specific feature, even with an uninferred power consumer, an electric current detected by a current supplier is transmitted to the power supplier. This makes it possible to monitor the electric power consumption in the entire household, including uninferred appliances, and also to infer appliances based on the electric currents detected by the current sensors in the power supplier.

According to another specific feature, the controller includes a storage which stores a history of changes in the electric currents detected respectively by the current sensors. This makes it possible to infer appliances properly based on the history of changes in the electric currents.

<Other Modifications>

For the sake of convenient description, the various features of the different examples described above are all merely extractions of distinctive traits; in practice, unillustrated or undescribed features are also involved. The features in one example is not unique to it; that is, the various features are exchangeable or compatible between different examples.

INDUSTRIAL APPLICABILITY

The present invention finds applications in power management systems, and in power outlet units such as wall sockets and power strips.

LIST OF REFERENCE SIGNS 4, 72 power supplier
6 power meter
26, 56 current sensor
10 controller
18, 19, 42, 76, 80 power outlet
20, 54 switch
182, 183 power consumer
26, 56 current sensor
110, 111 controller
172 power supplier
122, 144 socket
120, 154 switch
176, 182 power outlet unit
182 converter power outlet
176 converter power tap
13, 113 storage

The invention claimed is:

1. A power management system, comprising:
a power supplier;
a power meter which detects total power consumption of electric power supplied from the power supplier;
a plurality of current sensors which detect electric currents passing respectively through a plurality of power consumers connected to the power supplier; and
a controller which calculates power consumption by each of the plurality of power consumers based on the plurality of current sensors which detect electric currents passing through a plurality of power consumers, respectively, and the total power consumption by the plurality of power consumers, the total power consumption being detected in total by the power meter without direct detection of respective power consumptions by the plurality of power consumers.

2. The power management system according to claim 1, further comprising:
a power outlet unit to which electric power is supplied from the power supplier, the power outlet unit including a plurality of outlets to which the plurality of power consumers are connected respectively, wherein the plurality of current sensors are provided respectively in the plurality of outlets to which the plurality of power consumers are connected respectively.

3. The power management system according to claim 2, wherein the controller controls supply of electric power to the respective outlets.

4. The power management system according to claim 2, wherein the power outlet unit includes a transmitter which transmits results of current detection by the current sensors to the power supplier.

5. The power management system according to claim 1, wherein the controller includes an inferrer which infers kinds of the plurality of power consumers based on the electric currents detected respectively by the plurality of current sensors.

6. A power management system, comprising:
a power supplier;
a plurality of current sensors which detect electric currents supplied from the power supplier and passing respectively through a plurality of power consumers wherein kinds of the plurality of power consumers are not preliminarily informed; and
a controller which infers the kind of each of the plurality of power consumers based on the electric currents detected respectively by the plurality of current sensors.

7. The power management system according to claim 6, wherein the controller is provided in the power supplier.

8. The power management system according to claim 6, further comprising:
a power outlet unit which receives electric power from the power supplier, the power outlet unit including a plurality of outlets to which the plurality of power consumers are connectible and a plurality of switches which control supply of electric power to the outlets respectively, wherein the current sensors and a controller are provided in the power outlet unit.

9. The power management system according to claim 6, wherein the controller infers kinds of the power consumers based on variation of the electric currents passing through the power consumers.

10. The power management system according to claim 9, wherein the controller infers the kinds of the power consumers based on one of, or a combination of two or more of, a maximum current, a current variation width, and a current variation pattern with respect to the electric currents passing through the power consumers.

11. The power management system according to claim 6, wherein the controller infers the kinds of the power consumers based on a time factor with respect to the electric currents passing through the power consumers.

12. The power management system according to claim 11, wherein the controller infers the kinds of the power consumers based on one of, or a combination of, a current consumption time zone and a current consumption frequency with respect to the electric currents consumed by the power consumers.

13. The power management system according to claim 6, wherein the controller includes a storage in which a history of variation of the electric currents as fed from the current sensors is stored.

14. The power management system according to claim 8, wherein the plurality of current sensors are provided in the power outlet unit, and the power outlet unit includes a communicator which transmits, to the power supplier, results of current detection by the plurality of current sensors and which receives, from the power supplier, control signals for controlling the plurality of switches.

15. The power management system according to claim 14, wherein, even when a control signal is received from the power supplier, a switch corresponding to a outlet to which an uninferred power consumer is connected is not controlled.

16. The power management system according to claim 6 further comprising a power meter which detects power consumption by the plurality of power consumers in total, wherein the controller infers the kind of each of the plurality of power consumers based on the electric currents detected respectively by the plurality of current sensors and the power consumption by the plurality of power consumers in total detected by power meter.

\* \* \* \* \*